United States Patent
Epple et al.

(10) Patent No.: US 10,139,734 B2
(45) Date of Patent: Nov. 27, 2018

(54) IMAGING OPTICAL UNIT AND PROJECTION EXPOSURE APPARATUS FOR PROJECTION LITHOGRAPHY, HAVING SUCH IMAGING OPTICAL UNIT

(71) Applicant: Carl Zeiss SMT GmbH, Oberkochen (DE)

(72) Inventors: Alexander Epple, Aalen (DE); Ralf Mueller, Aalen (DE); Hans-Juergen Rostalski, Oberkochen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 500 days.

(21) Appl. No.: 14/524,162

(22) Filed: Oct. 27, 2014

(65) Prior Publication Data
US 2015/0293457 A1 Oct. 15, 2015

Related U.S. Application Data
(63) Continuation of application No. PCT/EP2013/060004, filed on May 15, 2013.
(Continued)

(30) Foreign Application Priority Data
May 25, 2012 (DE) .................. 10 2012 208 793

(51) Int. Cl.
G03B 27/70 (2006.01)
G03B 27/54 (2006.01)
(Continued)

(52) U.S. Cl.
CPC ....... *G03F 7/7025* (2013.01); *G02B 17/0663* (2013.01); *G03F 7/70058* (2013.01); *G03F 7/70233* (2013.01); *G03F 7/70308* (2013.01)

(58) Field of Classification Search
CPC ............ G02B 17/0663; G02B 17/0642; G02B 17/0621; G03F 7/70058; G03F 7/70233;
(Continued)

(56) References Cited

U.S. PATENT DOCUMENTS 5,815,310 A 9/1998 Williamson
6,750,948 B2 6/2004 Omura
(Continued)

FOREIGN PATENT DOCUMENTS

CN 101 836 164 A 9/2010
CN 102317866 A 1/2012
(Continued)

OTHER PUBLICATIONS

German Office Action, with translation thereof, for corresponding DE Appl No. 10 2012 208 793.1, dated Jun. 20, 2012.
(Continued)

*Primary Examiner* — Christina Riddle
(74) *Attorney, Agent, or Firm* — Fish & Richardson P.C.

(57) ABSTRACT

An imaging optical unit for imaging an object field in an image field is disclosed. The imaging optical unit has an obscured pupil. This pupil has a center, through which a chief ray of a central field point passes. The imaging optical unit furthermore has a plurality of imaging optical components. A gravity center of a contiguous pupil obscuration region of the imaging optical unit lies decentrally in the pupil of the imaging optical unit.

22 Claims, 14 Drawing Sheets

Related U.S. Application Data

(60) Provisional application No. 61/651,605, filed on May 25, 2012.

(51) Int. Cl.
  G03F 7/20 (2006.01)
  G02B 17/06 (2006.01)

(58) Field of Classification Search
  CPC .... G03F 7/7025; G03F 7/701; G03F 7/70083;
  G03F 7/70308; G03F 7/70358; G03F
  7/7002; G03F 7/2004; G03F 7/2037;
  G03F 7/70239; G03F 7/70225
  USPC .......... 355/52, 53, 55, 60, 66, 67–71, 77;
  250/492.1, 492.2, 492.22, 492.23, 493.1,
  250/503.1; 359/363–366, 857–859, 861,
  359/869
  See application file for complete search history.

(56) References Cited

U.S. PATENT DOCUMENTS

| | | | |
|---|---|---|---|
| 7,522,260 | B1 | 4/2009 | Kirchner et al. |
| 2006/0232867 | A1* | 10/2006 | Mann .................... G02B 13/143 359/858 |
| 2007/0047069 | A1 | 3/2007 | Mann et al. |
| 2007/0058269 | A1 | 3/2007 | Mann et al. |
| 2010/0195075 | A1* | 8/2010 | Chan ...................... B82Y 10/00 355/67 |
| 2010/0231885 | A1 | 9/2010 | Mann |
| 2010/0231886 | A1 | 9/2010 | Mann |
| 2012/0208115 | A1 | 8/2012 | Loering et al. |
| 2014/0078484 | A1 | 3/2014 | Mann et al. |

FOREIGN PATENT DOCUMENTS

| | | | |
|---|---|---|---|
| DE | 10 2005 003 557 A1 | 8/2006 | |
| DE | 10 2008 042 917 A1 | 4/2009 | |
| DE | 102008043162 | 4/2009 | |
| DE | 10 2009 046 685 A1 | 5/2011 | |
| JP | 2013-543658 | 12/2013 | |
| WO | WO 2010/091800 A1 | 8/2010 | |
| WO | WO 2011/057906 A1 * | 5/2011 | ............ G02B 5/005 |
| WO | WO 2011/095209 A1 | 8/2011 | |
| WO | WO 2011/131289 A1 | 10/2011 | |
| WO | WO 2012/034995 A2 | 3/2012 | |
| WO | WO 2012/041720 A2 | 4/2012 | |

OTHER PUBLICATIONS

Chinese office action and search report, with English translation, for CN Appl No. 2013 8002 7245.X, dated May 20, 2016.

International Search Report for corresponding PCT APpl No. PCT/EP2013/060004, dated Aug. 14, 2013.

Yang et al., "Effect of Central Obscuration on Image Formation in Projection Lithography", Optical/ Laser Microlithography III. San Jose, Mar. 7-9, 1990; [Proceedings of the Conference on Optical / Laser Microlithography], Bellingham, SPIE, US, vol. 1264, Mar. 7, 1990 (Mar. 7, 1990), pp. 477-485.

Japanese office action, with English translation thereof, for corresponding JP Appl No. 2015-513090, dated Jan. 31, 2017.

Chinese Office Action including Search Report, with translation thereof, for corresponding Appl No. 201380027345.X, dated Apr. 5, 2017.

Japanese office action, with English translation thereof, for corresponding JP Appl No. 2015-513090, dated Jan. 31, 2018.

* cited by examiner

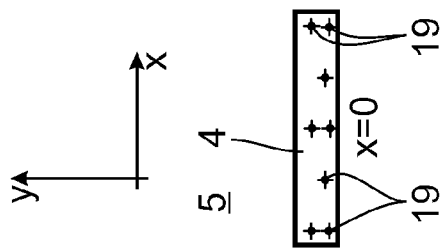
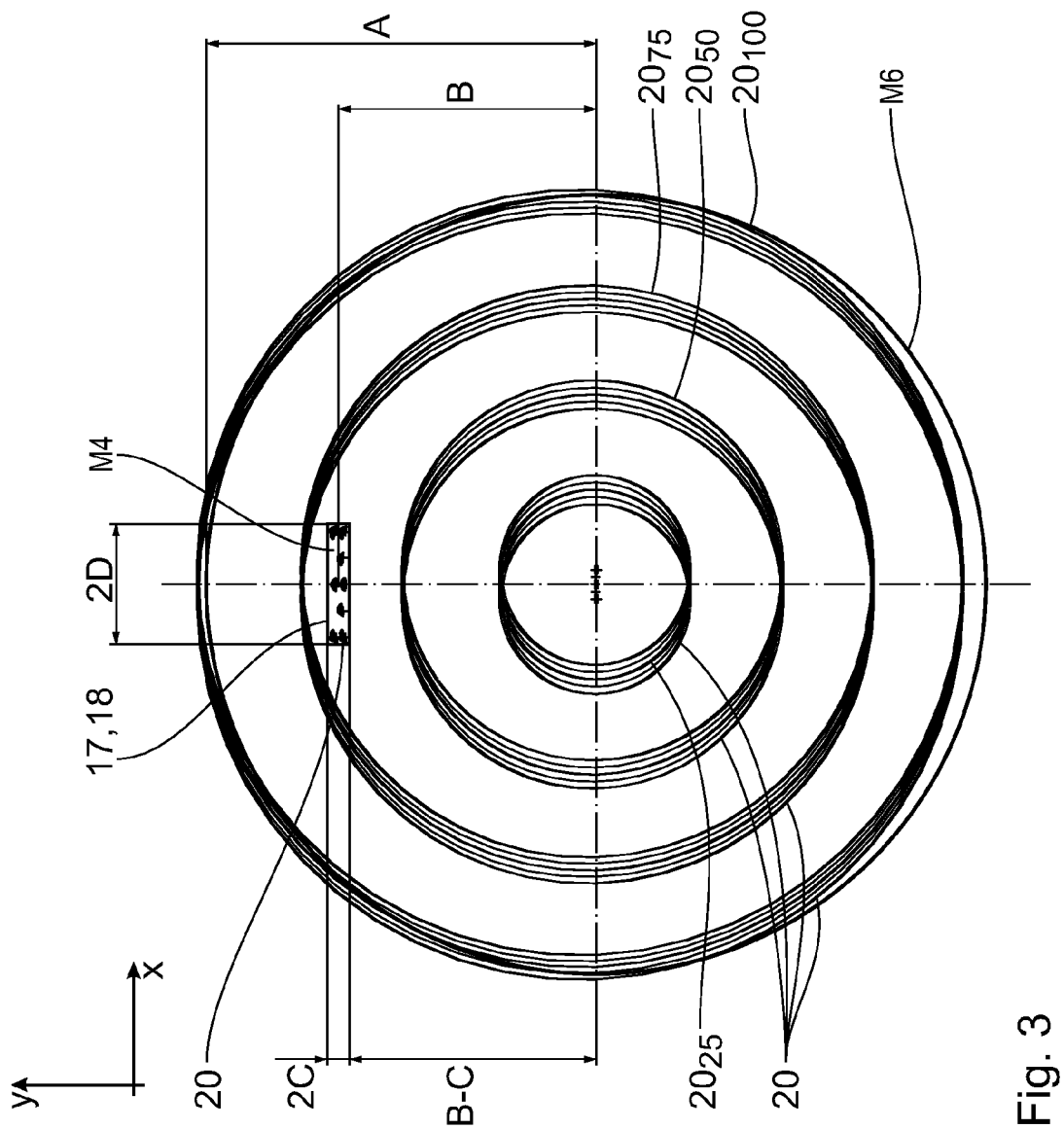

IMAGING OPTICAL UNIT AND PROJECTION EXPOSURE APPARATUS FOR PROJECTION LITHOGRAPHY, HAVING SUCH IMAGING OPTICAL UNIT

CROSS-REFERENCE TO RELATED APPLICATIONS

The present application is a continuation of, and claims benefit under 35 USC 120 to, international application PCT/EP2013/060004, filed May 15, 2013, which claims benefit under 35 USC 119 of German Application No. 10 2012 208 793.1, filed May 25, 2012. International application PCT/EP2013/060004 also claims priority under 35 USC 119(e) to U.S. Provisional Application No. 61/651,605, filed May 25, 2012. The entire disclosure of international application PCT/EP2013/060004 and German Application No. 10 2012 208 793.1 are incorporated by reference herein.

The invention relates to an imaging optical unit with a plurality of optical components, in particular mirrors, which image an object field in an object plane in an image field in an image plane. The invention furthermore relates to an optical system with such an imaging optical unit, a projection exposure apparatus with such an optical system, a method for producing a microstructured or nanostructured component using such a projection exposure apparatus and a microstructured or nanostructured component produced via this method.

Imaging optical units of the type mentioned at the outset are known from DE 10 2009 046 685 A1, U.S. Pat. No. 5,815,310, DE 10 2005 003 557 A1, WO 2010/091800 A1, U.S. Pat. No. 6,750,948 B2 and WO 2011/095209 A1.

It is an object of the present invention to develop an imaging optical unit of the type mentioned at the outset in such a way that a well corrected imageable field results with, at the same time, a high imaging light throughput.

According to the invention, this object is achieved by an imaging optical unit for imaging an object field in an image field,
wherein the imaging optical unit has an obscured pupil,
wherein the pupil has a center, through which a chief ray of a central field point passes,
with a plurality of imaging optical components,
wherein a gravity center or centroid of a contiguous pupil obscuration region of the imaging optical unit lies decentrally in the pupil of the imaging optical unit.

A pupil of the imaging optical unit is that region in an imaging beam path of the imaging optical unit in which individual imaging rays, which emanate from the object field points, intersect and are respectively associated with the same illumination angle relative to chief rays which emanate from these object field points. An intensity distribution of imaging light in a pupil plane, in which the pupil is arranged, correspondingly predetermines that range of illumination angles which reach the image field. There is always an imaging optical unit with an obscured pupil if there is a pupil obscuration region of impossible or forbidden illumination or imaging angles for each field point within a peripheral pupil of the imaging optical unit which is predetermined by the numerical aperture. Thus, in the case of an imaging optical unit with obscured pupil, there are imaging beam paths which, as a result of obscuration between components of the imaging optical unit or as a result of a region on at least one of the optical components of the imaging optical unit which do not contribute to the imaging beam path, are impossible. The invention departs from the previous demand that, in the case of obscured systems, a pupil obscuration region is always arranged in such a way that the gravity center thereof lies centrally in the pupil of the imaging optical unit. Departing from this demand leads to new degrees of freedom in the design, which can be used to bring about improved aberration correction. In particular, it was identified that imaging optical units with pupil obscurations can be realized, in which the pupil obscuration for illumination angles used in practice does not reduce the throughput.

A mirror symmetry of the pupil obscuration region, in which the pupil obscuration region is mirror symmetrical with respect to a plane of symmetry of the imaging optical unit, provides the option of a corresponding mirror symmetrical design of the imaging optical unit. The plane of symmetry can be a meridional plane of the imaging optical unit.

An embodiment of the pupil obscuration region, in which the center of the pupil lies outside of the pupil obscuration region, renders it possible for chief rays, i.e. rays which extend through the center of the pupil, to contribute to the imaging. This can be used, in particular, if specific orders of diffraction of the imaging light extend along the chief rays.

A diameter relationship, in which the pupil has a pupil diameter in a pupil plane of the imaging optical unit, wherein a completely usable pupil region about the center of the pupil has a diameter which is at least 10% of the pupil diameter, enables the use of a correspondingly large central pupil region without obscuration. The completely usable pupil region about the center of the pupil can be at least 20%, can be at least 30%, can be at least 40%, can be at least 50%, or can even be a greater percentage, of the pupil diameter. To the extent that the pupil and the completely usable pupil region are circular, the respective diameter corresponds to the diameter of the circle. In the case of other shapes of the pupil and/or of the completely usable pupil region about the center, a typical diameter is specified as diameter, which for example is the result of averaging the various diameters.

A pupil obscuration region, in which the pupil obscuration region
has a radial pupil obscuration region extent in a radial dimension along a gravity center axis, on which the center of the pupil and the gravity center of the pupil obscuration region lie,
has a tangential pupil obscuration region extent in a tangential dimension perpendicular to the gravity center axis,
wherein the radial pupil obscuration region extent differs from the tangential pupil obscuration region extent by more than 10%,
can be finely adapted to guiding the imaging radiation through the imaging optical unit. The tangential pupil obscuration region extent can be greater than the radial one. In particular, the radial pupil obscuration region extent can differ from the tangential one by more than 20%, by more than 30%, by more than 40%, by more than 50% or else by an even larger percentage. The tangential pupil obscuration region extent can be a multiple of the radial pupil obscuration region extent.

An embodiment of the imaging optical unit as catoptric lens allows a high throughput even in the case of used wavelengths for which no sufficiently transmissive optical materials are available.

An embodiment of the imaging optical unit according to the invention with a penultimate mirror and a last mirror in the imaging beam path upstream of the image field, wherein a chief ray of a central field point impinges on the last mirror of the imaging optical unit at an angle of incidence, wherein, in the imaging beam path upstream of the penultimate mirror, the chief ray passes through a passage opening in the last mirror and extends along a passage chief ray section, wherein the chief ray extends along an image field chief ray section between the last mirror and the image field, wherein the two chief ray sections extend in a common plane and include a chief ray angle between one another, wherein the angle of incidence is greater than the chief ray angle, enables a mirror arrangement, in particular, in which a center of the last mirror upstream of the image field can be used, which can contribute to a reduction of aberrations.

An additional obscuration component which generates an additional pupil obscuration region, wherein the two pupil obscuration regions complement one another to form an overall pupil obscuration region which is arranged in a centrally symmetric fashion with respect to the center (Z) of the pupil, can be used when imaging relationships are demanded which require a centrally symmetric pupil obscuration.

According to a further aspect of the invention, the object specified at the outset is achieved by a catoptric imaging optical unit for imaging an object field in an image field, wherein the imaging optical unit has an obscured pupil, wherein the pupil has a center, through which a chief ray of a central field point passes, with a last mirror in the imaging beam path between the object field and the image field, wherein the last mirror has a passage opening for the passage of imaging light, wherein an edge region of a reflection surface of the last mirror, which edge region surrounds the passage opening, is used contiguously for reflecting the imaging light, with a penultimate mirror in the imaging beam path, with a reflection surface which is used in a completely contiguous or closed fashion, i.e. without an opening, wherein the passage opening is arranged in such a way that this generates a pupil obscuration region, which does not lie centrally in the pupil of the imaging optical unit.

The advantages of a decentrally arranged pupil obscuration region are particularly pronounced in the case of a catoptric imaging optical unit with a penultimate mirror used in a completely contiguous closed fashion. Here, it is not mandatory for the pupil obscuration region to have a gravity center which lies decentrally in the pupil of the imaging optical unit.

In accordance with a further aspect of the invention, the object stated at the outset is achieved by an imaging optical unit for imaging an object field in an image field, wherein the imaging optical unit has an obscured pupil, wherein an overall pupil obscuration region of the imaging optical unit or portions thereof has an aspect ratio which deviates from 1 with respect to mutually perpendicular coordinates of a pupil coordinate system.

An obscuration with an aspect ratio which deviates from 1 can be finely adapted to the illumination angles required within an illumination pupil and to the necessity of an arrangement of non-obscured pupil regions in order to pass illumination light which is diffracted there on structures of an object to be imaged. An aspect ratio between a smaller obscuration dimension and a larger obscuration dimension can be of the order of 0.9, can be of the order of 0.8, can be of the order of 0.7, can be of the order of 0.6, can be of the order of 0.5, can be of the order of 0.4, can be of the order of 0.3 or can be even less than that.

The pupil obscuration region of this last-mentioned aspect can consist of contiguous portions or of a plurality of portions. The contiguous pupil obscuration region or at least one of the portions can be shaped like an ellipse, a rectangle or a trapezoid. In the case of an angular shape of the pupil obscuration region or of a portion thereof, at least individual corners, or all corners, of the pupil obscuration region or of the portions thereof can be embodied in a rounded-off fashion.

The features of the imaging optical units of the aspects explained above can be used together in any combination thereof.

The advantages of an optical system with an imaging optical unit according to the invention and an illumination optical unit for guiding the illumination light to the imaging optical unit, of a projection exposure apparatus for projection lithography with an optical system according to the invention and a light source for the illumination and imaging light, of a method for producing a structured component, comprising the following method steps:

providing a reticle and a wafer, projecting a structure on the reticle onto a light-sensitive layer of the wafer with the aid of the projection exposure apparatus according to the invention, generating a microstructure or nanostructure on the wafer, and of a microstructured or nanostructured component produced according to this method, correspond to those that were already discussed in the context of the imaging optical unit according to the invention.

Exemplary embodiments of the invention will be explained in more detail below on the basis of the drawing. In detail:

FIG. 1 schematically shows a projection exposure apparatus for EUV microlithography;

FIG. 2 shows a meridional section of an embodiment of an imaging optical unit, which can be used as projection lens in the projection exposure apparatus according to FIG. 1, wherein an imaging beam path for chief rays and for an upper and a lower coma ray of two selected field points is illustrated;

FIG. 3 shows a plan view of a last mirror of the imaging optical unit according to FIG. 2, in the imaging beam path in front of the image field, and of an antepenultimate mirror of the imaging optical unit, which antepenultimate mirror is arranged in an imaging light passage opening of this last mirror, wherein, for eight representative field points of a complete object field of the imaging optical unit, aperture zones for 25%, 50%, 75% and 100% of an object-side numerical aperture of the imaging optical unit, so-called footprints, are respectively illustrated;

FIG. 3a shows a plan view of the object field for clarifying a position of the representative field points, which are selected for illustrating the aperture zones according to FIG. 3;

Figure 2:
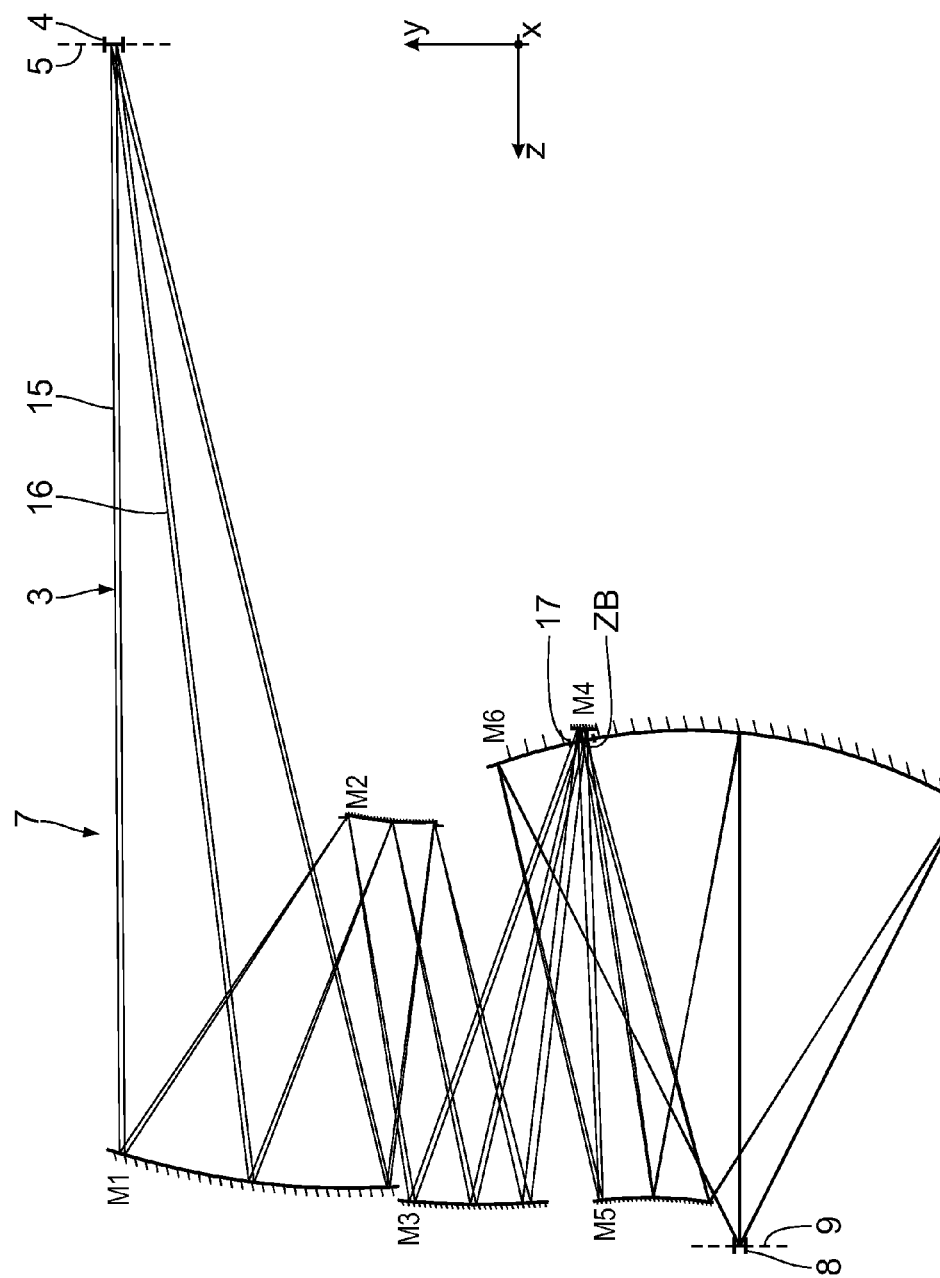
Figure 4:
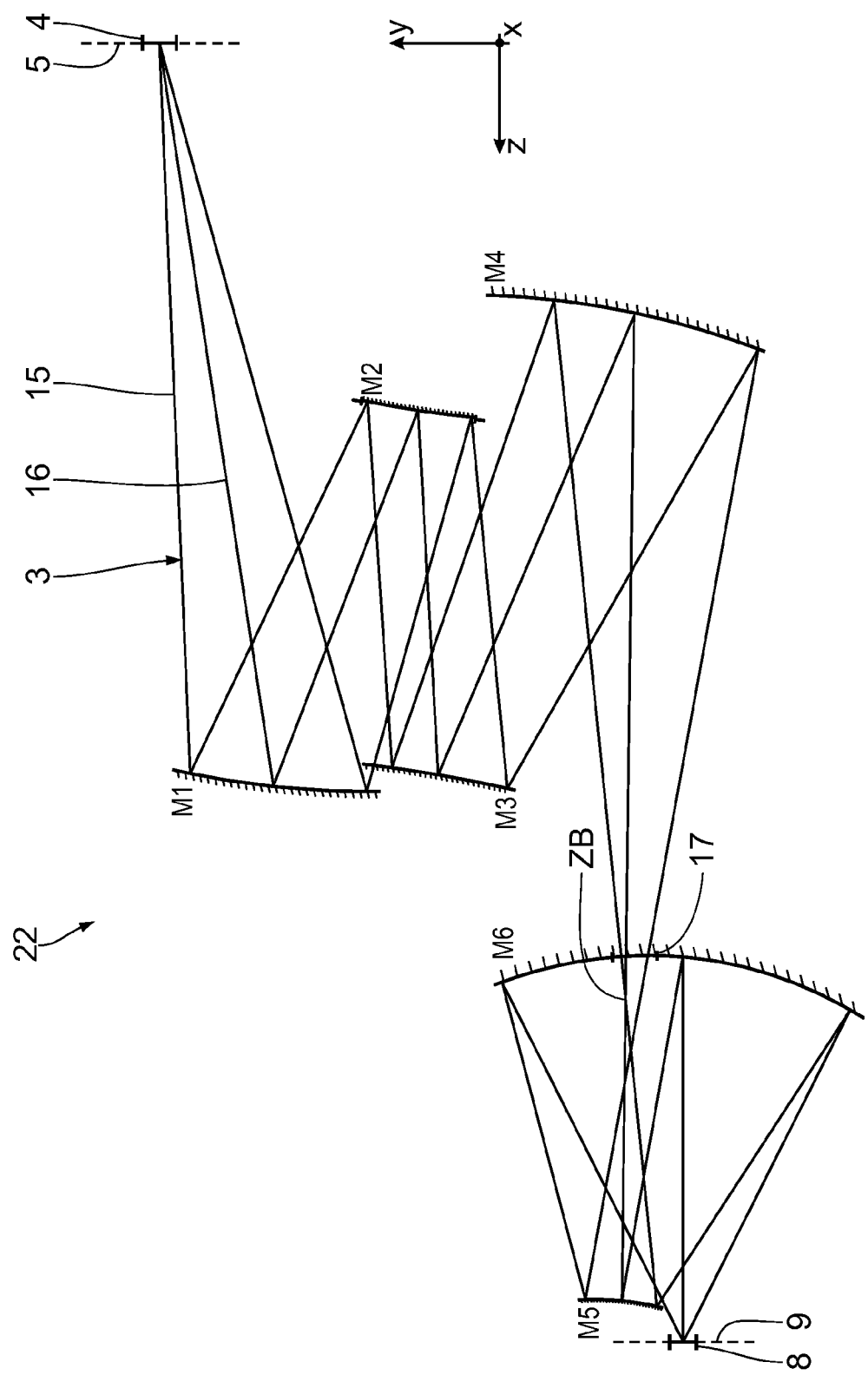
FIG. 4 shows a further embodiment of an imaging optical unit, in an illustration similar to that of FIG. 2.
Figure 6:
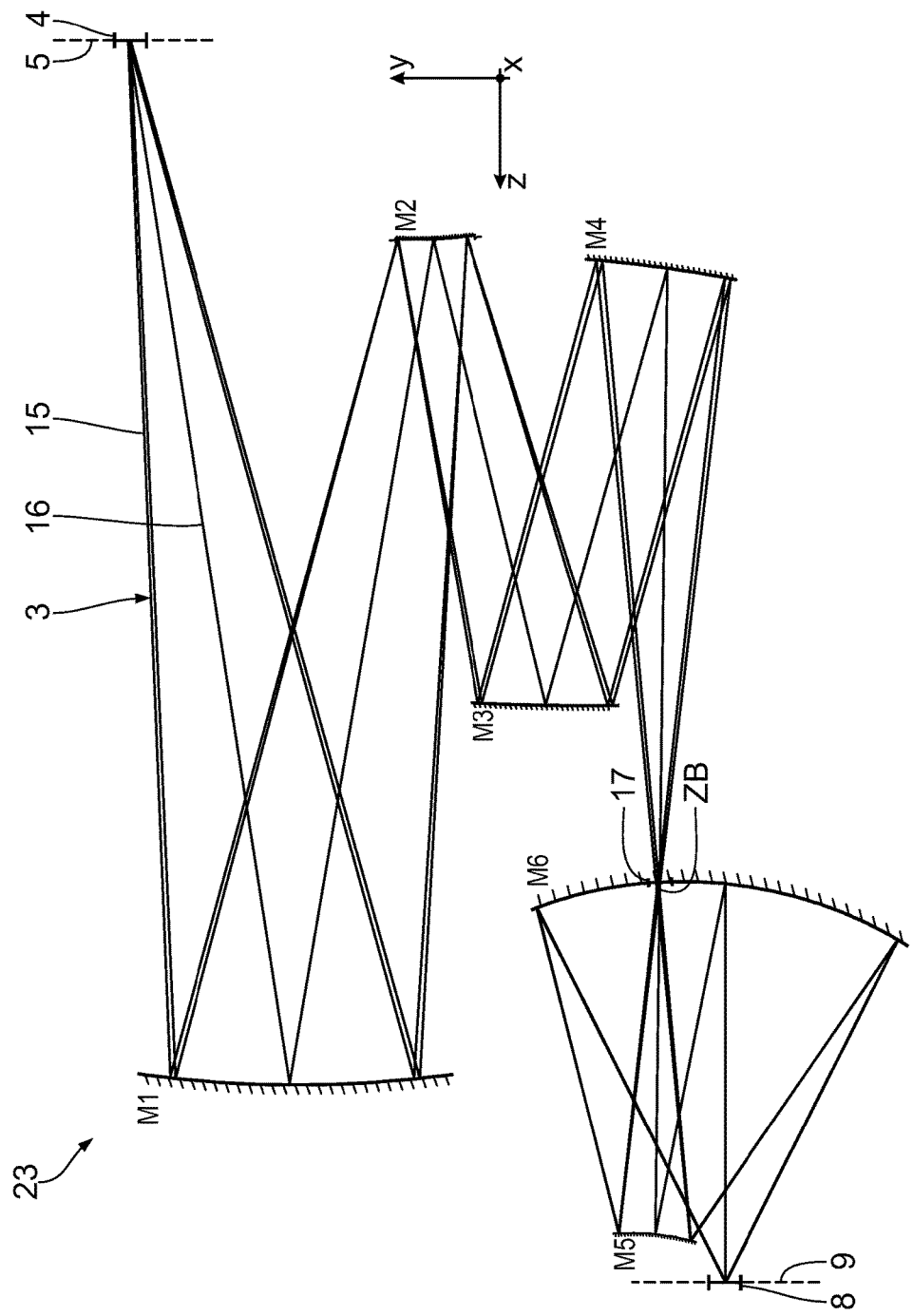
FIGS. 6 and 7 show a further embodiment of an imaging optical unit in illustrations similar to those in FIGS. 4 and 5.
Figure 10:
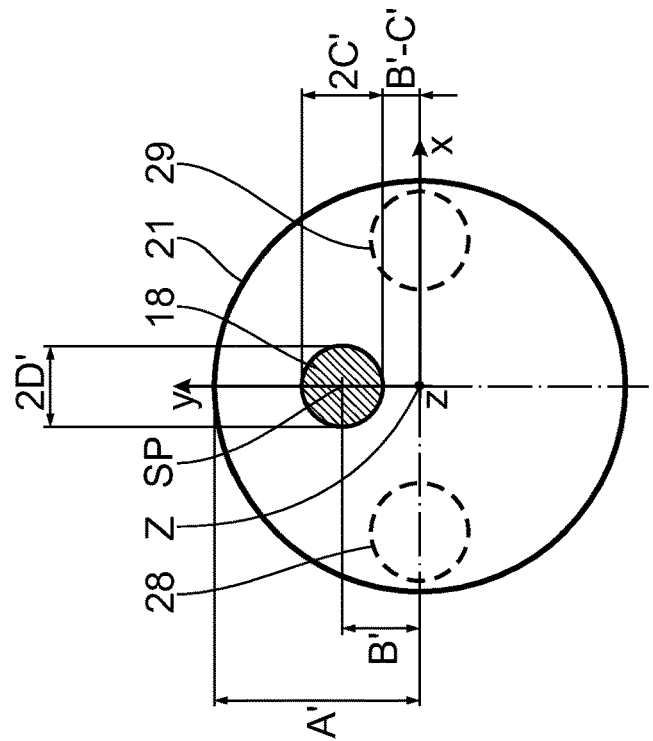
Figure 9:
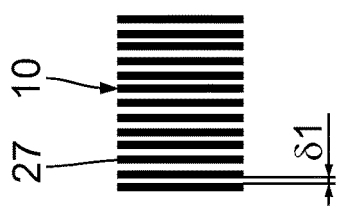
Figure 8:
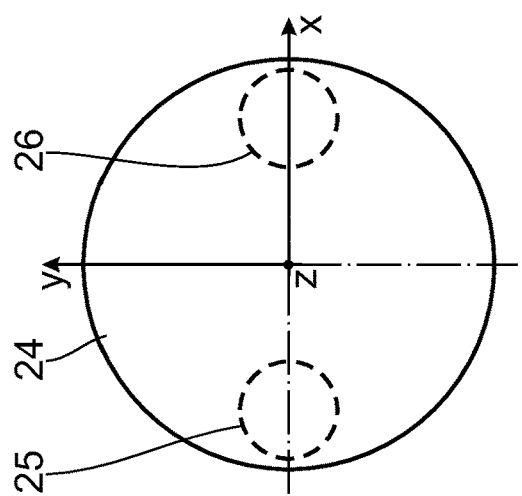
FIG. 8 shows an intensity distribution of an illumination of a y-line structure in a pupil plane of an illumination optical unit for illuminating the object field of an imaging optical unit according to FIGS. 2, 4 and 6 with a decentral pupil obscuration region, wherein there is illumination in the form of an x-dipole.
Figure 13:
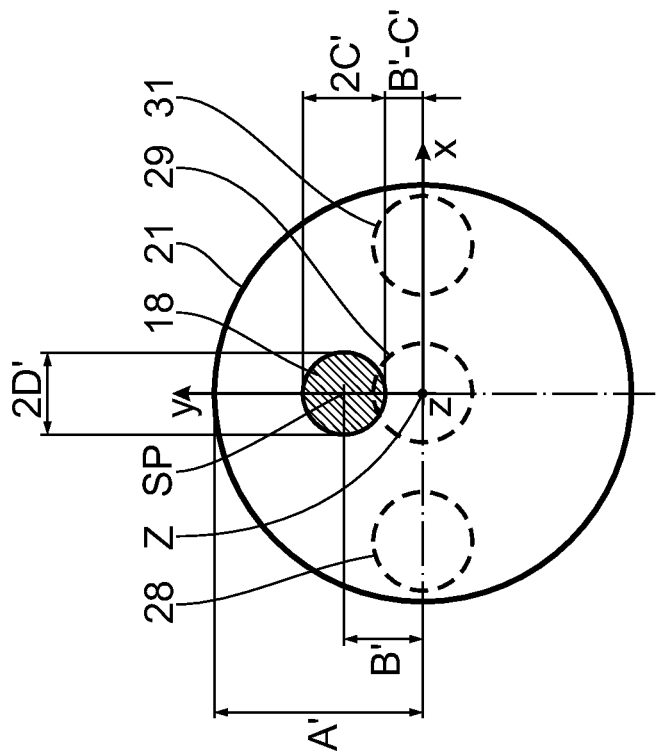
Figure 12:
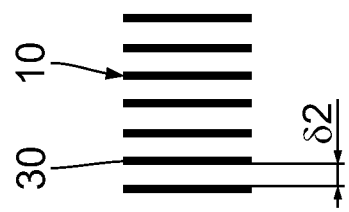
Figure 11:
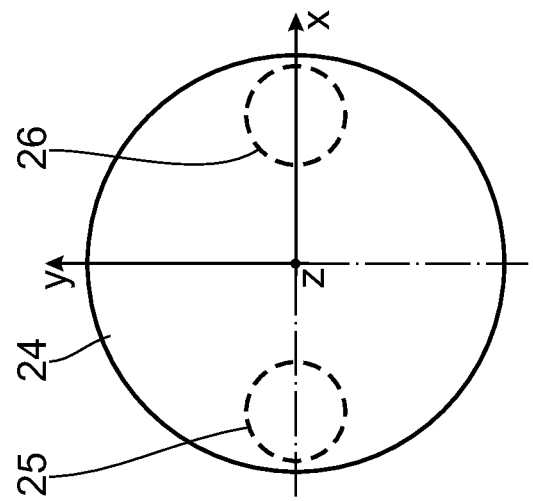
Figure 16:
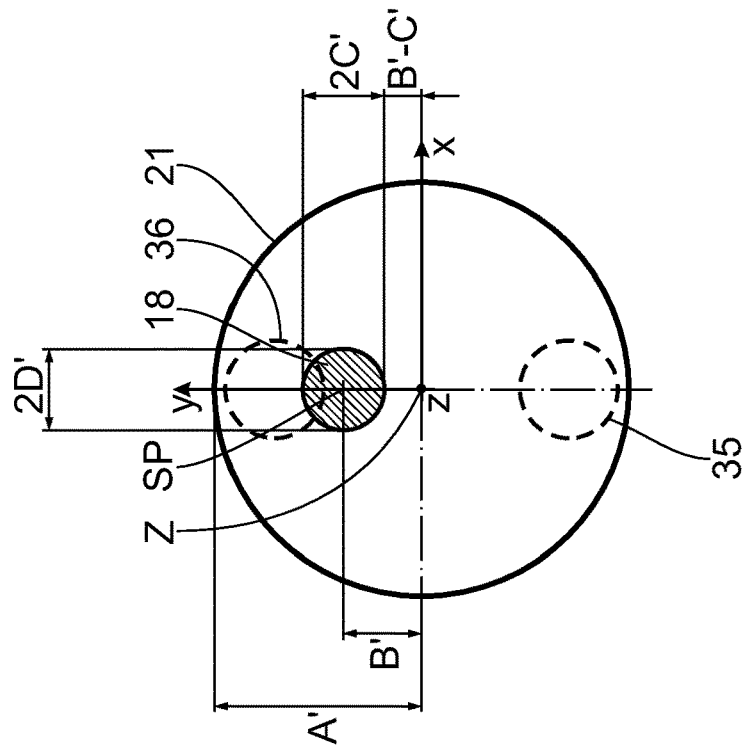
Figure 15:
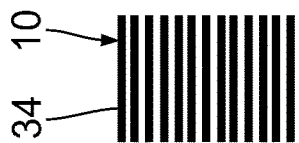
Figure 14:
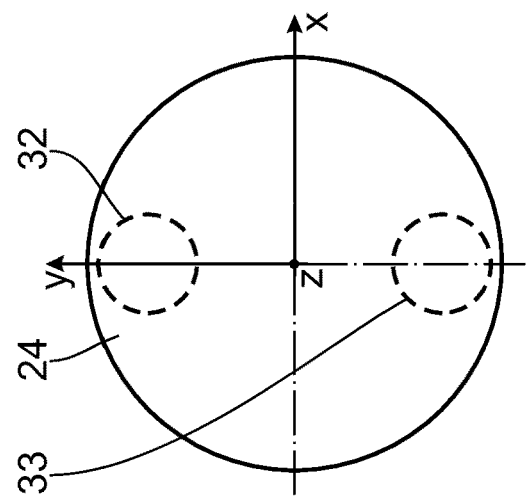
Figure 19:
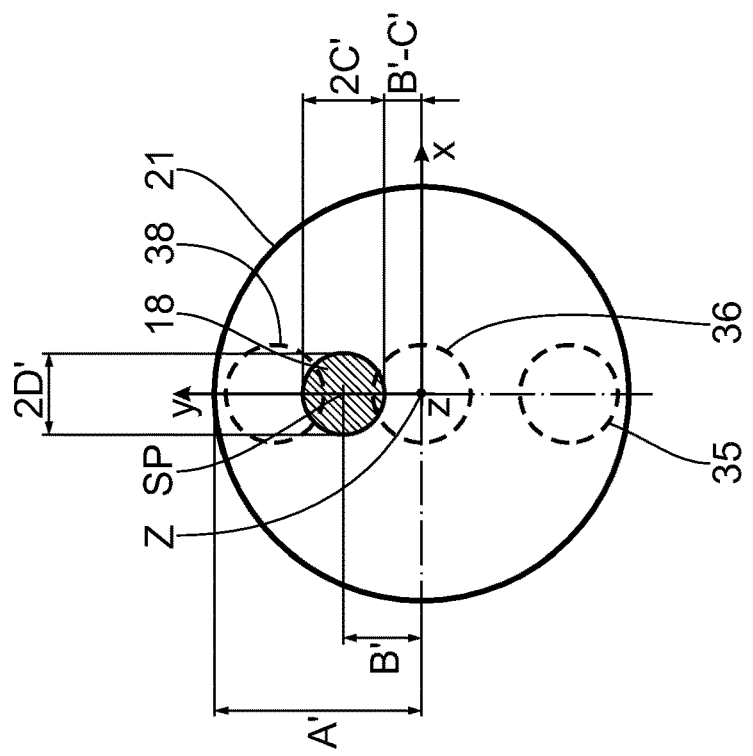
Figure 18:
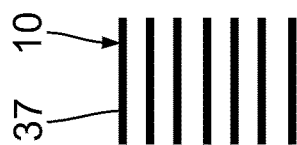
Figure 17:
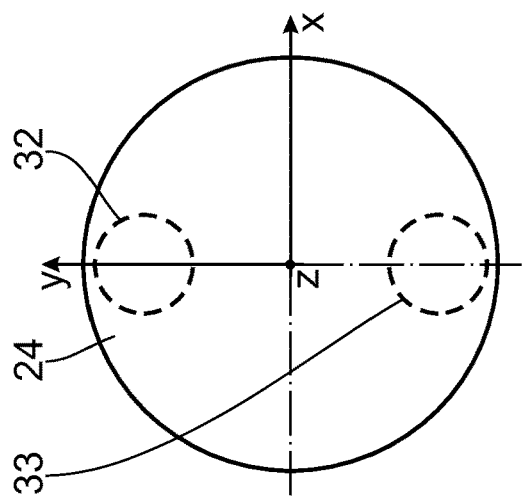
Figure 20:
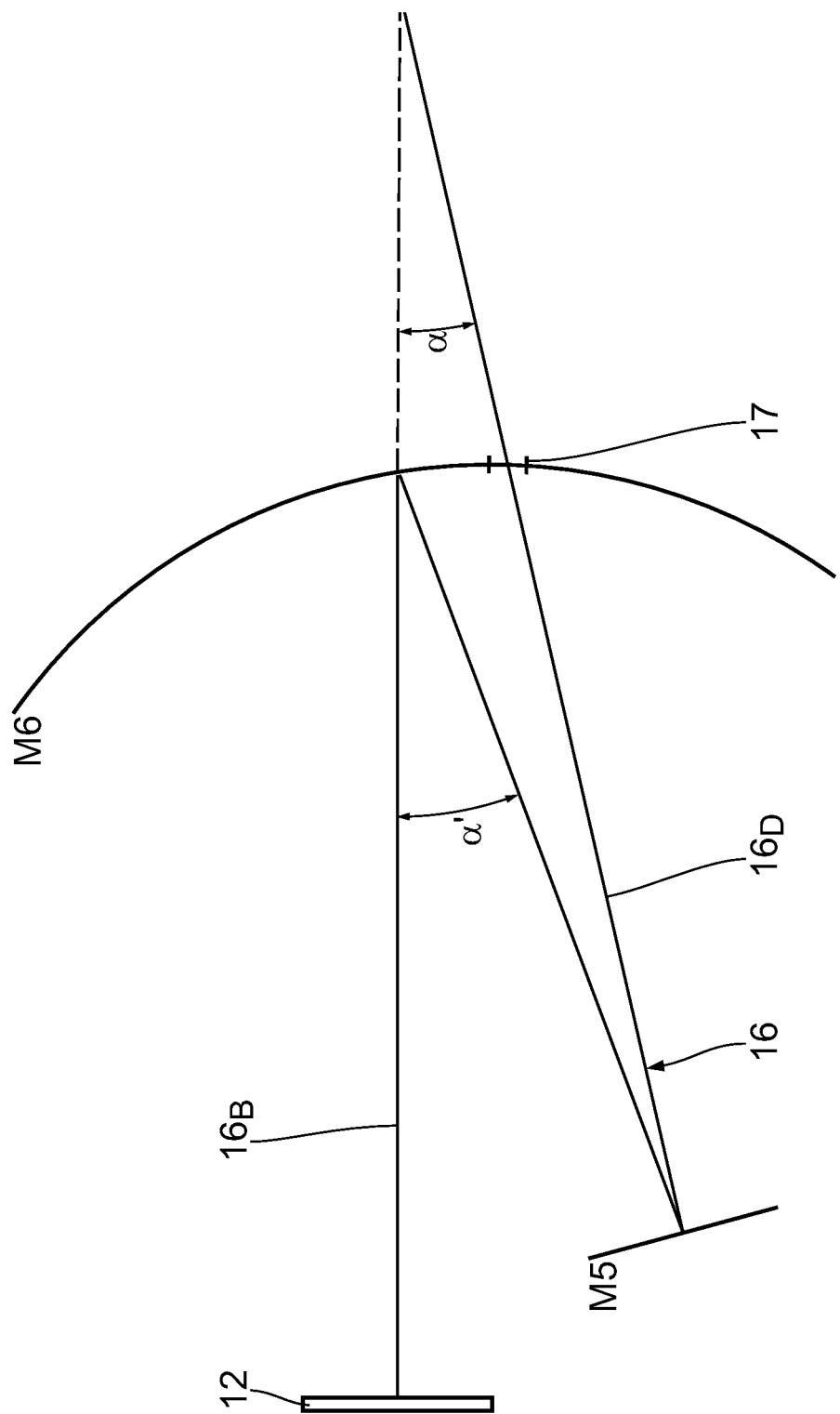

FIG. 9 schematically shows a y-line structure illuminated in accordance with FIG. 8, which y-line structure is arranged in the object field;

FIG. 10 likewise schematically shows an intensity distribution of imaging light of one of the poles of the dipole illumination according to FIG. 8 in a pupil plane of one of the imaging optical units according to FIG. 2, 4 or 6, wherein, additionally, a pupil obscuration region is illustrated, which results on account of the imaging light passage opening in the last mirror in the imaging beam path of the imaging optical unit, wherein only absolute values of the intensity of a pole of the dipole illumination according to FIG. 8 are taken into account;

FIGS. 11 to 13 show, in schematic illustrations similar to FIGS. 8 to 10, the relationships when illuminating and imaging a y-line structure with, compared to FIG. 9, less tightly packed lines;

FIG. 14 shows, in an illustration similar to FIG. 8, an intensity distribution of illumination light in an illumination pupil plane for a y-dipole illumination;

FIG. 15 shows, in an illustration similar to FIG. 9, an x-line structure which is illuminated with an illumination setting according to FIG. 14;

FIG. 16 shows, in an illustration similar to FIG. 10, an intensity distribution of imaging light in a pupil plane of one of the imaging optical units according to FIG. 2, 4 or 6, wherein only absolute values of the intensity of a pole of the dipole illumination according to FIG. 14 are taken into account;

FIGS. 17 to 19 show, in schematic illustrations similar to FIGS. 14 to 16, the relationships when illuminating and imaging an x-line structure with, compared to FIG. 15, less tightly packed lines;

FIG. 20 shows, very schematically, angular relationships of a chief ray of a central field point in the region of the last mirror of the imaging optical units according to FIGS. 2, 4 and 6; and FIGS. 21 to 26 show, in illustrations similar to FIGS. 8 to 13 or 14 to 19, the relationships when illuminating and imaging a y-line structure with, compared to the embodiment according to FIGS. 8 to 13, a different pupil obscuration.

A projection exposure apparatus 1 for microlithography has a light source 2 for illumination light or imaging light 3. The light source 2 is an EUV light source which generates light in a wavelength region of, for example, between 5 nm and 30 nm, in particular between 5 nm and 15 nm. The light source 2 can, in particular, be a light source with a wavelength of 13.5 nm or a light source with a wavelength of 6.9 nm. Other EUV wavelengths are also possible. In general, use can even be made of any wavelength for the illumination light 3 guided in the projection exposure apparatus 1, for example visible wavelengths or else other wavelengths which can find use in microlithography and for which suitable laser light sources and/or LED light sources are available (e.g. 365 nm, 248 nm, 193 nm, 157 nm, 129 nm, 109 nm). A beam path of the illumination light 3 is illustrated very schematically in FIG. 1.

An illumination optical unit 6 serves for guiding the illumination light 3 from the light source 2 to an object field 4 in an object plane 5. Using a projection optical unit or imaging optical unit 7, the object field 4 is imaged in an image field 8 in an image plane 9 with a predetermined reduction scale. In the x-direction, the image field 8 has an extent of 26 mm and the image field extends 2 mm in the y-direction. The object field 4 and the image field 8 are rectangular. One of the exemplary embodiments illustrated in FIGS. 2 and 5 can be used as the projection optical unit 7. The projection optical unit 7 according to FIG. 2 reduces by a factor of 4. Other reduction scales are also possible, for example 5x, 8x, or even reduction scales which are greater than 8x. In the embodiments according to FIGS. 2 and 5 of the projection optical unit 7, the image plane 9 is arranged parallel to the object plane 5. A section of a reflection mask 10 which is also referred to as a reticle and coincides with the object field 4 is imaged in this case. The reticle 10 is held by a reticle holder 10a. The reticle holder 10a is displaced by a reticle displacement drive 10b.

The imaging by the projection optical unit 7 takes place onto the surface of a substrate 11 in the form of a wafer, which is held by a substrate holder 12. The substrate holder 12 is displaced by a wafer or substrate displacement drive 12a.

Figure 1:
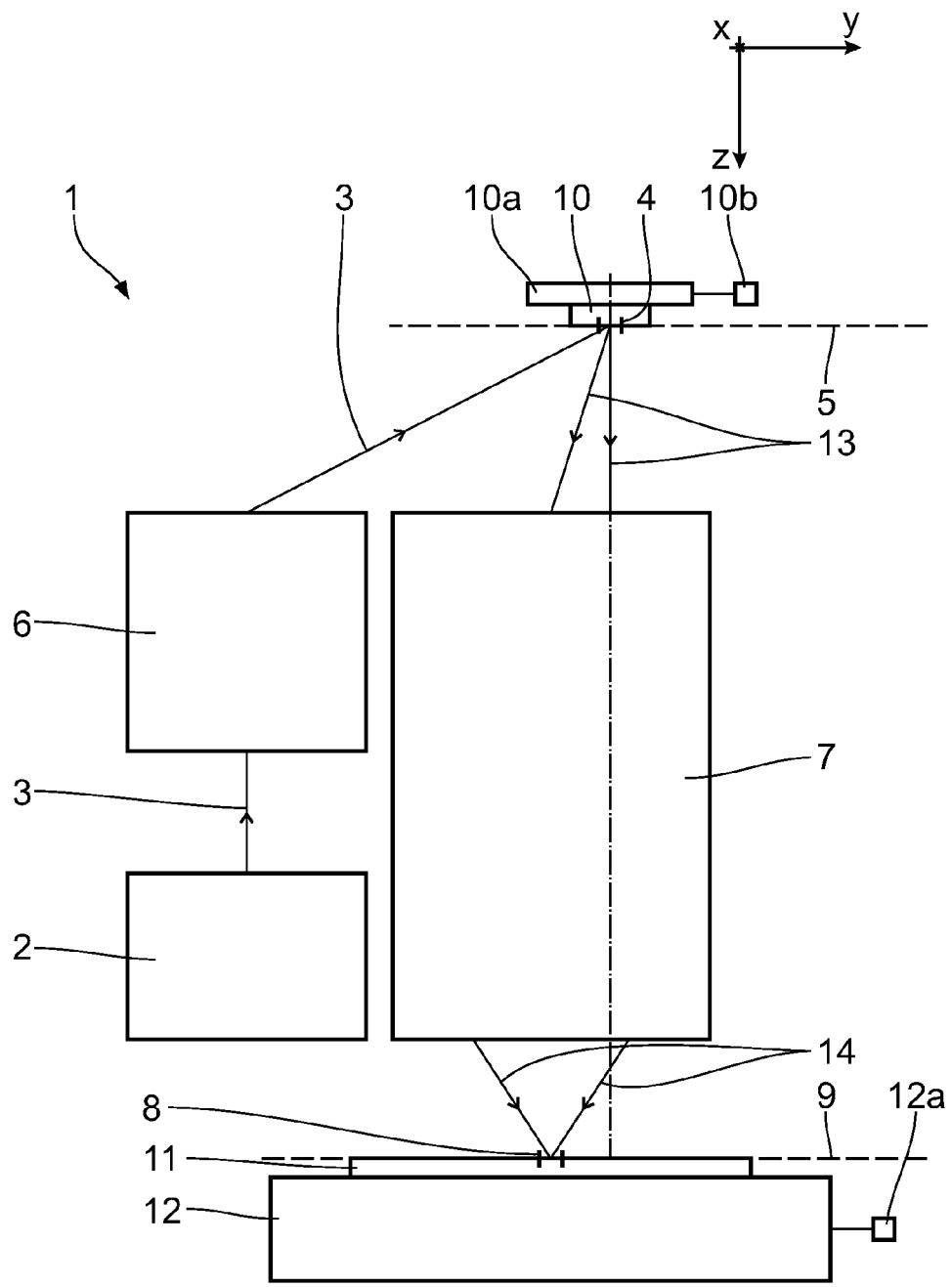

In FIG. 1, a beam 13 of the illumination light 3 entering the projection optical unit 7 is schematically illustrated between the reticle 10 and the projection optical unit and a beam 14 of the illumination light 3 leaving the projection optical unit 7 is illustrated schematically between the projection optical unit 7 and the substrate 11. An image field-side numerical aperture (NA) of the projection optical unit 7 is not reproduced to scale in FIG. 1.

In order to simplify the description of the projection exposure apparatus 1 and of the various embodiments of the projection optical unit 7, a Cartesian xyz-coordinate system is specified in the drawing, from which the respective positional relations of the components illustrated in the figures emerge. In FIG. 1, the x-direction extends perpendicular to the plane of the drawing and into the latter. The y-direction extends to the right and the z-direction extends downward.

The projection exposure apparatus 1 is a scanner-type one. Both the reticle 10 and the substrate 11 are scanned in the y-direction during operation of the projection exposure apparatus 1. A stepper-type projection exposure apparatus 1, in which there is a step-wise displacement of the reticle 10 and of the substrate 11 in the y-direction between the individual exposures of the substrate 11, is also possible. These displacements occur in a synchronized fashion with respect to one another as a result of an appropriate actuation of the displacement drives 10b and 12a.

FIG. 2 shows the optical design of a first embodiment of the projection optical unit 7. Illustrated in FIG. 2 is the beam path of in each case three individual rays 15, which emanate from two object field points which, in FIG. 2, are spaced apart from one another in the y-direction. Chief rays 16 are illustrated, i.e. individual rays 15 which pass through the center of a pupil in a pupil plane of the projection optical unit 7, and, in each case, an upper and a lower coma ray of these two object field points.

The object plane 5 lies parallel to the image plane 9.

The projection optical unit 7 according to FIG. 2 has a total of six mirrors, which, in the sequence of the beam path of the individual rays 15, are numbered in sequence by M1 to M6 proceeding from the object field 4. The imaging optical unit 7 can also have a different number of mirrors, for example four mirrors or eight mirrors. The calculated reflection surfaces of mirrors M1 to M6 are illustrated in FIG. 2. As can be seen from the illustration according to FIG. 2, only a portion of these calculated reflection surfaces is used. Only this actually used region of the reflection surfaces is in actual fact present in the real mirrors M1 to M6. These used reflection surfaces are held by mirror bodies in a known fashion.

Apart from mirror M6, all mirrors M1 to M5 of the projection optical unit 7 have a contiguously used reflection surface, without a passage opening for the imaging light 3. The penultimate mirror M5 in the imaging beam path between the object field 4 and the image field 8 in particular has a completely contiguous or closed used reflection surface, i.e. one without an opening.

The mirrors M1 to M6 carry multiple reflection layers for optimizing their reflection for the incident EUV illumination light 3. The multiple reflection layers are designed for a work wavelength of 13.5 nm. The optimization of the reflection can be improved the closer the angle of incidence of the individual rays 15 on the mirror surface is to perpendicular incidence. Overall, the projection optical unit 7 has small angles of reflection for all individual rays 15.

All six mirrors M1 to M6 of the projection optical unit 7 are embodied as free-form surfaces which cannot be described by a rotational symmetric function. Other embodiments of the projection optical unit 7, in which at least one or even none of the mirrors M1 to M6 has such a free-form reflection surface, are also possible.

Such a free-form surface can be generated from a rotationally symmetric reference surface. Such free-form surfaces for reflection surfaces of the mirrors of projection optical units of projection exposure apparatuses for microlithography are known from US 2007-0058269 A1.

Mathematically, the free-form surface can be described by the following equation as the sum of a conical base area and a free-form surface polynomial (Equation 1) or as a sum of a biconical base area and a free-form surface polynomial (Equation 2):

$$Z = \frac{cr^2}{1 + \sqrt{1 - (1+k)c^2 r^2}} + \sum_{j=2}^{N} C_j X^m Y^n \qquad (1)$$

or $$Z = \frac{c_x x^2 + c_y y^2}{1 + \sqrt{1 - (1+k_x)(c_x x)^2 - (1+k_y)(c_y y)^2}} + \sum_{j=2}^{N} C_j X^m Y^n \qquad (2)$$

where, in each case, the following applies:

$$j = \frac{(m+n)^2 + m + 3n}{2} + 1$$

Z is the sagittal height of the free-form surface at the point x, y, wherein $x^2 + y^2 = r^2$.

In the case of a conical base area, c is a constant which corresponds to the apex curvature of a corresponding aspheric lens element. k corresponds to a conical constant of a corresponding aspheric lens element. In the case of a biconical base area, $c_x$, $c_y$ are the apex curvatures in meridional and sagittal directions, $k_x$, $k_y$ are the associated conical constants. $C_j$ are the coefficients of the monomials $X^m Y^n$. The values of c, k and $C_j$ are typically determined on the basis of the desired optical properties of the mirror within the projection optical unit 7. The order of the monomial, m+n, can be varied arbitrarily. A higher-order monomial can lead to a design of the projection optical unit with improved aberration correction, but is more complicated to calculate. m+n can assume values between 3 and more than 20.

Free-form surfaces can also be described mathematically by Zernike polynomials. In this case, a polynomial in the form of a Zernike polynomial is added to the conical (Equation 3) or biconical (Equation 4) base area:

$$Z = \frac{cr^2}{1 + \sqrt{1 - (1+k)c^2 r^2}} + \sum_{i=1}^{N} ZFR_i(r, \varphi) \qquad (3)$$

or $$Z = \frac{c_x x^2 + c_y y^2}{1 + \sqrt{1 - (1+k_x)(c_x x)^2 - (1+k_y)(c_y y)^2}} + \sum_{i=1}^{N} ZFR_i(r, \varphi) \qquad (4)$$

Here, the Zernike polynomials $ZFR_i$ used in the exemplary embodiments are specified in polar coordinates using the Fringe index illustrated below (the sign * means multiplication in this case; the sign ^ means exponent in this case, i.e. r^n=$r^n$):

ZFR1(r,phi)=1

ZFR3(r,phi)=r sin(phi)

ZFR4(r,phi)=2*r^2−1

ZFR5(r,phi)=r^2 cos(2phi)

ZFR8(r,phi)=(3*r^3−2*r)sin(phi)

ZFR9(r,phi)=6*r^4−6*r^2+1

ZFR11(r,phi)=r^3 sin(3phi)

ZFR12(r,phi)=(4*r^4−3*r^2)cos(2phi)

ZFR15(r,phi)=(10*r^5−12*r^3+3*r)sin(phi)

ZFR16(r,phi)=20*r^6−30*r^4+12*r^2−1

ZFR17(r,phi)=r^4 cos(4phi)

ZFR20(r,phi)=(5*r^5−4*r^3)sin(3phi)

ZFR21(r,phi)=(15*r^6−20*r^4+6*r^2)cos(2phi)

ZFR24(r,phi)=(35*r^7−60*r^5+30*r^3−4*r)sin(phi)

ZFR25(r,phi)=70*r^8−140*r^6+90*r^4−20*r^2+1

ZFR27(r,phi)=r^5 sin(5phi)

ZFR28(r,phi)=(6*r^6−5*r^4)cos(4phi)

ZFR31(r,phi)=(21*r^7−30*r^5+10*r^3)sin(3phi)

ZFR32(r,phi)=(56*r^8−105*r^6+60*r^4−10*r^2)cos(2phi)

$ZFR35(r,phi)=(126*r^9-280*r^7+210*r^5-60*r^3+5*r)\sin(phi)$ $ZFR36(r,phi)=252*r^{10}-630*r^8+560*r^6-210*r^4+30*r^2-1$ $ZFR37(r,phi)=r^6 \cos(6phi)$ $ZFR40(r,phi)=(7*r^7-6*r^5)\sin(5phi)$ $ZFR41(r,phi)=(28*r^8-42*r^6+15*r^4)\cos(4phi)$ $ZFR44(r,phi)=(84*r^9-168*r^7+105*r^5-20*r^3)\sin(3phi)$ $ZFR45(r,phi)=(210*r^{10}-504*r^8+420*r^6-140*r^4+15*r^2)\cos(2phi)$ $ZFR48(r,phi)=(462*r^{11}-1260*r^9+1260*r^7-560*r^5+105*r^3-6*r)\sin(phi)$ $ZFR49(r,phi)=924*r^{12}-2772*r^{10}+3150*r^8-1680*r^6+420*r^4-42*r^2+1$ $ZFR51(r,phi)=r^7 \sin(7phi)$ $ZFR52(r,phi)=(8*r^8-7*r^6)\cos(6phi)$ $ZFR55(r,phi)=(36*r^9-56*r^7+21*r^5)\sin(5phi)$ $ZFR56(r,phi)=(120*r^{10}-252*r^8+168*r^6-35*r^4)\cos(4phi)$ $ZFR59(r,phi)=(330*r^{11}-840*r^9+756*r^7-280*r^5+35*r^3)\sin(3phi)$ $ZFR60(r,phi)=(792*r^{12}-2310*r^{10}+2520*r^8-1260*r^6+280*r^4-21*r^2)\cos(26phi)$ $ZFR63(r,phi)=(1716*r^{13}-5544*r^{11}+6930*r^9-4200*r^7+1260*r^5-168*r^3+7*r)\sin(phi)$ $ZFR64(r,phi)=3432*r^{14}-12012*r^{12}+16632*r^{10}-11550*r^8+4200*r^6-$ $756*r^4+56*r^2-1$ $ZFR65(r,phi)=r^8 \cos(8phi)$ $ZFR68(r,phi)=(9*r^9-8*r^7)\sin(7phi)$ $ZFR69(r,phi)=(45*r^{10}-72*r^8+28*r^6)\cos(6phi)$ $ZFR72(r,phi)=(165*r^{11}-360*r^9+252*r^7-56*r^5)\sin(5phi)$ $ZFR73(r,phi)=(495*r^{12}-1320*r^{10}+1260*r^8-504*r^6+70*r^4)\cos(4phi)$ $ZFR76(r,phi)=(1287*r^{13}-3960*r^{11}+4620*r^9-2520*r^7+630*r^5-56*r^3)\sin(3phi)$ $ZFR77(r,phi)=(3003*r^{14}-10296*r^{12}+13860*r^{10}-9240*r^8+3150*r^6-$ $504*r^4+28*r^2)\cos(2phi)$ $ZFR80(r,phi)=(6435*r^{15}-24024*r^{13}+36036*r^{11}-27720*r^9+11550*r^7-$ $2520*r^5+252*r^3-8*r)\sin(phi)$ $ZFR81(r,phi)=12870*r^{16}-51480*r^{14}+84084*r^{12}-72072*r^{10}+34650*r^8-$ $9240*r^6+1260*r^4-72*r^2+1$ $ZFR83(r,phi)=r^9 \sin(9phi)$ Here, $r=\sqrt{x^2+y^2}$/HNorm specifies the radial coordinate and $\varphi=\arctan(y/x)$ specifies the azimuth coordinate if the ray penetration point on the surface is given by the coordinates x and y and HNorm is the normalization height of the Zernike polynomials specified in the data.

Alternatively, the free-form surfaces can also be described with the aid of two-dimensional spline surfaces. Examples of this are Bézier curves or non-uniform rational basis splines (NURBS). By way of example, two-dimensional spline surfaces can be described by a network of points in an xy-plane and associated z-values or by these points and gradients associated therewith. Depending on the respective type of the spline surface, the complete surface is obtained by interpolating between the node points using e.g. polynomials or functions which have specific properties in respect of their continuity and differentiability. Examples of this are analytic functions.

The optical design data of the reflection surfaces of the mirrors M1 to M6 of the projection optical unit 7 can be gathered from the following tables. In each case, these optical design data proceed from the image plane 9, i.e. describe the respective projection optical unit in the reverse direction of travel to the imaging light 3 between the image plane 9 and the object plane 5. The first of these tables respectively specifies a thickness in mm for the optical surfaces of the optical components, which thickness corresponds to the z-distance of neighboring elements in the beam path, proceeding from the image plane 6. The second table specifies (in mm) the apex radii RD=1/c or RDY=1/$c_y$ and RDX=1/$c_x$, the conical constants k or $k_x$ and $k_y$ and the coefficients $ZFR_i$ for the respectively used Zernike polynomials in the above Equation (4) for mirrors M1 to M6.

After the second table, the third table still specifies the absolute value along which the respective mirror, proceeding from a mirror reference design, was decentered in the y-direction (DCY) and tilted (TLA). This corresponds to a parallel displacement and tilting in the case of the free-form surface design method. The displacement in this case is in the y-direction in mm, and the tilt is about the x-axis. Here, the tilt angle is specified in degrees. Decentration is carried out first, followed by tilting.

In the first table, the column "half diameter" specifies the half diameter of the respective back surface of the mirror.

TABLE 1 for FIG. 2

| Surface | Thickness | Operating mode | Half diameter |
| --- | --- | --- | --- |
| Image plane | 746.817508 |  | 13.0 |
| M6 | −675.774825 | REFL | 345.5 |
| M5 | 680.981038 | REFL | 87.1 |
| M4 | −691.475802 | REFL | 20.1 |
| M3 | 557.272397 | REFL | 109.1 |
| M2 | −524.089625 | REFL | 64.7 |
| M1 | 1655.915452 | REFL | 214.1 |
| Object plane | 0.000000 |  | 52.2 |

TABLE 2 for FIG. 2

| Coeff. | M6 | M5 | M4 | M3 | M2 | M1 |
|---|---|---|---|---|---|---|
| RDY | −815.057307 | −596.791207 | −1956.667423 | 1050.689137 | 523.97455 | 1123.534155 |
| KY | 0 | 0 | 0 | 0 | 0 | 0 |
| RDX | −815.057307 | −596.791207 | −1956.667423 | 1050.689137 | 523.97455 | 1123.534155 |
| KX | 0 | 0 | 0 | 0 | 0 | 0 |
| RNorm | 345.513288 | 87.084161 | 20.085491 | 109.138967 | 64.710555 | 214.099747 |
| ZFR1 | 2.036811E−01 | −2.101583E−01 | 9.791675E−01 | −4.753100E−01 | 6.084620E−01 | −1.328328E−01 |
| ZFR3 | −4.622368E−02 | −4.102648E−01 | 4.106187E−02 | 2.279709E−02 | −9.223826E−02 | −4.974433E−01 |
| ZFR4 | 1.502672E−01 | 1.536718E−01 | 8.932223E−05 | −3.387677E−02 | 2.096394E−01 | 7.287420E−02 |
| ZFR5 | 3.302350E−01 | 5.040206E−01 | −8.889011E−05 | 2.318947E−01 | 7.172789E−01 | 4.427369E−01 |
| ZFR8 | 8.795437E−02 | −1.434357E−01 | −4.062397E−04 | −3.281428E−02 | −6.511851E−02 | −1.651685E−01 |
| ZFR9 | −3.559607E−02 | −3.392360E−02 | 4.921593E−04 | 2.654508E−04 | −4.745611E−03 | −3.497452E−03 |
| ZFR11 | 1.004011E−02 | 3.628111E−02 | 1.693453E−04 | −4.183872E−03 | −7.144762E−03 | 6.697639E−03 |
| ZFR12 | 1.730550E−02 | 1.297749E−02 | −9.794616E−04 | 2.906227E−04 | −3.569628E−03 | −9.266403E−04 |
| ZFR15 | 4.526505E−03 | −2.323429E−03 | −3.126011E−05 | −1.982810E−04 | 4.877192E−04 | −8.735480E−04 |
| ZFR16 | −2.917863E−03 | −5.905068E−04 | 1.799711E−04 | 2.655795E−05 | 1.181737E−04 | −7.109215E−05 |
| ZFR17 | −2.994194E−04 | 9.478602E−04 | 1.001084E−03 | 4.747523E−04 | 2.271353E−03 | −1.439265E−03 |
| ZFR20 | 6.219079E−05 | 1.157360E−03 | 4.052376E−05 | −6.681817E−05 | −5.005303E−04 | 3.123340E−04 |
| ZFR21 | 6.536598E−04 | 2.552431E−04 | −3.621016E−05 | −4.103436E−05 | 8.117940E−05 | 1.579492E−05 |
| ZFR24 | 3.220819E−04 | −8.108927E−05 | 4.005703E−06 | −9.657608E−06 | 7.003652E−05 | −2.502405E−06 |
| ZFR25 | −1.896372E−04 | −2.111256E−05 | 3.161891E−05 | 8.523002E−07 | 1.649085E−05 | 8.158673E−07 |
| ZFR27 | 2.680758E−04 | −7.076978E−04 | −6.299177E−05 | 4.565672E−04 | 4.565672E−04 | −2.721424E−04 |
| ZFR28 | 1.510469E−04 | −9.954929E−05 | 3.686861E−04 | 2.795910E−05 | −2.228120E−04 | −1.188503E−06 |
| ZFR31 | 2.320984E−05 | 1.438855E−05 | −2.533954E−06 | 6.834100E−06 | 3.831664E−06 | 1.199150E−06 |
| ZFR32 | 4.652245E−05 | 1.670763E−05 | −6.326679E−05 | −1.370904E−06 | −4.765698E−06 | −2.511811E−06 |
| ZFR35 | 2.415836E−05 | −3.841364E−06 | −3.217605E−07 | 1.791326E−08 | 6.486622E−06 | 7.332762E−08 |
| ZFR36 | −1.244025E−05 | 7.117801E−08 | −8.442395E−09 | 1.261726E−07 | 2.170458E−06 | −1.800178E−07 |
| ZFR37 | 7.879613E−05 | −5.417742E−05 | −3.778169E−04 | −1.462566E−05 | −9.263605E−05 | 3.111337E−05 |
| ZFR40 | −4.165405E−05 | 8.788441E−06 | −1.820640E−07 | −5.651706E−06 | −3.146613E−05 | 4.259077E−06 |
| ZFR41 | 8.547584E−06 | −5.659171E−06 | 6.343531E−05 | 9.577000E−05 | −7.285168E−06 | 1.848286E−06 |
| ZFR44 | 2.234432E−06 | 9.584126E−07 | 2.316297E−07 | −2.553392E−08 | 3.847438E−06 | −2.421499E−07 |
| ZFR45 | 3.924061E−06 | −1.193827E−07 | 1.235361E−08 | −9.582351E−08 | −1.631403E−06 | 1.752521E−07 |
| ZFR48 | 2.227496E−06 | 8.729072E−08 | −2.222237E−10 | 7.608607E−09 | 5.313205E−07 | 1.233056E−07 |
| ZFR49 | −4.201928E−07 | −1.498689E−07 | 1.003075E−10 | −4.132475E−08 | −2.077396E−07 | 3.557007E−08 |
| ZFR51 | −2.412428E−05 | −1.698821E−05 | 5.866886E−06 | 4.328044E−06 | −5.755093E−06 | −8.305904E−06 |
| ZFR52 | −7.394132E−06 | 3.230933E−06 | −6.412281E−05 | −5.566292E−07 | 3.485552E−06 | −1.214308E−06 |
| ZFR55 | −3.600384E−06 | −4.411820E−07 | −1.314337E−07 | 1.472451E−08 | −2.563601E−06 | 8.082309E−08 |
| ZFR56 | 1.342046E−06 | −1.070350E−07 | −8.665432E−10 | 5.264635E−08 | −9.649445E−07 | 5.944878E−08 |
| ZFR59 | −6.193205E−07 | 4.532158E−08 | 1.104728E−09 | 2.595852E−09 | −4.773032E−07 | 2.256681E−08 |
| ZFR60 | 6.485333E−07 | 1.695111E−07 | −1.871342E−10 | −2.540259E−08 | −2.797744E−07 | −5.091072E−08 |
| ZFR63 | 2.498364E−07 | −5.628983E−08 | −3.559375E−11 | −5.937333E−09 | 8.172148E−08 | −1.186951E−08 |
| ZFR64 | −4.901480E−08 | −5.245460E−08 | 9.351954E−13 | 1.184856E−08 | 2.688409E−07 | 3.041063E−08 |
| ZFR65 | −4.724612E−06 | −3.197761E−06 | 6.526168E−05 | 6.044393E−07 | 2.129320E−06 | 2.710271E−06 |
| ZFR68 | 4.882484E−07 | | | | | |
| ZFR69 | −5.443848E−07 | | | | | |
| ZFR72 | −2.551561E−07 | | | | | |
| ZFR73 | −9.516715E−08 | | | | | |
| ZFR76 | −1.491079E−07 | | | | | |
| ZFR77 | 1.646531E−07 | | | | | |
| ZFR80 | 1.877854E−07 | | | | | |
| ZFR81 | −1.412473E−07 | | | | | |
| ZFR83 | 1.771759E−07 | | | | | |

TABLE 3 for FIG. 2

| Surface | Decentration DCX | Decentration DCY | Decentration DCZ | Tilt TLA [deg] | Tilt TLB [deg] | Tilt TLC [deg] |
|---|---|---|---|---|---|---|
| M6 | 0 | 0 | 0 | −5.284608 | 0 | 0 |
| M5 | 0 | 125.320915 | 0 | −1.128873 | 0 | 0 |
| M4 | 0 | 226.24722 | 0 | −2.23933 | 0 | 0 |
| M3 | 0 | 387.793853 | 0 | −0.574186 | 0 | 0 |
| M2 | 0 | 507.398054 | 0 | −4.987159 | 0 | 0 |
| M1 | 0 | 710.888395 | 0 | −7.305113 | 0 | 0 |
| Object plane | 0 | 911.110348 | 0 | 0 | 0 | 0 |

The projection optical unit 7 has an image-side numerical aperture of 0.45. The object field 4 has an x-extent of two-times 13 mm and a y-extent of 2 mm. The projection optical unit 7 is optimized for an operating wavelength of the illumination light 3 of 13.5 nm.

One of the pupil planes of the projection optical unit 7 according to FIG. 2 lies in the imaging beam path in the region of a reflection on the mirror M2. A further pupil plane of the projection optical unit 7 according to FIG. 2 lies in the imaging beam path between the mirrors M5 and M6.

In the projection optical unit 7 the mirrors M1, M3 and M5 have an only slightly different geometric distance from the image plane 9. This distance difference is less than 5% of the design length of the projection optical unit 7, i.e. the distance between the object plane 5 and the image plane 9.

The chief rays 16 of the object field points propagate substantially parallel to one another between the object field 4 and the mirror M1. Thus, the projection optical unit 7 according to FIG. 2 is substantially telecentric on the object side.

The projection optical unit 7 is a pure mirror optical unit, i.e. a catoptric imaging optical unit.

An intermediate image ZB of the projection optical unit 7 is arranged in an intermediate image plane in the imaging beam path in the region of a reflection at the mirror M4. The mirror M4 is configured as a field mirror adjacent to the intermediate image ZB.

The mirror M4 is arranged downstream of an imaging light passage opening 17 in the mirror M6. Hence, the imaging light 3 passes through the passage opening 17 in the mirror M6 just before and just after the reflection at the mirror M4. The passage opening 17 in the mirror M6 provides a pupil obscuration region 18 of the imaging optical unit 7 according to FIG. 2. Hence it is possible to specify a region of forbidden illumination angles in the pupil planes of the imaging optical unit 7, i.e. of illumination angles which belong to the imaging beam paths which, on account of the passage opening 17, do not contribute to imaging. This region of forbidden illumination angles is the pupil obscuration region 18. As a result of the pupil obscuration region 18, which predetermines the forbidden illumination angles, the projection optical unit 7 has an obscured pupil. More details in respect of the pupil obscuration region 18 will still be explained below in the context of FIG. 8f.

The mirror M4 satisfies the field mirror parameter relationship:

$$P(M4) < 0.5.$$

The following applies:

$$P(M) = D(SA)/(D(SA) + D(CR)).$$

Here, D(SA) is the maximum diameter of a sub-aperture of an imaging beam, which emanates from an object field point, on a reflecting surface of the respective mirror M. D(CR) is a maximum spacing of chief rays which emanate from the object field 4, wherein the spacing D(CR) is measured in a reference plane of the projection optical unit 7 on the reflecting surface of the mirror M. This maximum distance need not lie in the plane of the drawing of FIG. 2, but can, in particular, also be present in the object field 4 in the x-direction perpendicular to the plane of the drawing. In the field planes of the projection optical unit 7, D(SA)=0 applies and hence P=0. In the pupil planes of the projection optical unit 7, D(CR)=0 applies and hence P=1.

The reflection relationships for selected object field points on the mirrors M4 and M6 of the projection optical unit 7 according to FIG. 2 are explained in more detail below on the basis of FIGS. 3 and 3a.

FIG. 3a shows a section (not to scale) of the object plane 5 with the rectangular object field 4. In the x-direction, the object field 4 has an extent of 104 mm and, in the y-direction, it has an extent of 8 mm. A total of eight representative reference object field points 19 are highlighted.

FIG. 3 shows a plan view of the mirror M6 and, situated in or behind the rectangular passage opening 17, the mirror M4. FIG. 3 illustrates sub-apertures 20, i.e. outer edges of the imaging beams emanating from the reference object field points 19. Shown here are the sub-apertures $20_{25}$, $20_{50}$, $20_{75}$ and $20_{100}$, which respectively belong to 25%, to 50%, to 75% and to 100% of the numerical aperture of the projection optical unit 7 according to FIG. 2.

Since the mirror M4 is a near-field mirror, the sub-apertures $20_X$ of respectively one of the reference object field points 19 overlap in a tightly delimited region, which approximately corresponds to an image of the respective reference object field point 19. The sub-apertures $20_X$ of different reference object field points 19 do not overlap on the mirror M4.

The outer edges of the sub-apertures $20_X$ are separated on the comparatively pupil-near last mirror M6. The sub-apertures, which belong to a specific percentage of the numerical aperture of the projection optical unit 7, i.e., for example, the sub-apertures $20_{25}$, of the different reference object field points 19 overlap strongly there.

The passage opening 17 has such extents in the x- and y-directions that all sub-apertures $20_{100}$ of all object field points of the used object field 4, i.e., in particular, of the reference object field points 19, can pass without losses through the mirror M6 for reflecting the imaging light 3 at the mirror M4. In FIG. 3, an x-extent of the passage opening 17 is denoted by 2D and a y-extent of the passage opening 17 is denoted by 2C. A radius of the mirror M6 is denoted by A and a y-distance between a center of the passage opening 17 and a center of the mirror M6 is denoted by B.

In the projection optical unit 7 according to FIG. 2, B/A is 0.65. C/A is 0.03. D/A is 0.15. Moreover, the following applies: C<0.9 D, in particular C<0.8 D, C<0.7 D, C<0.6 D, C<0.5 D, C<0.4 D, C<0.3 D.

Since the mirror M6 is near the pupil, the pupil obscuration region 18, caused as a result of the obscuration by the passage opening 17, approximately has the shape of the passage opening 17 in a pupil plane of the projection optical unit 7. This is, once again, also indicated very schematically in FIG. 10, where the pupil obscuration region 18 is indicated as a round region in a used pupil 21 (see FIG. 10) of the projection optical unit 7 according to FIG. 2. The pupil obscuration region 18 can in fact also have a different shape than a round shape. The actual shape of the pupil obscuration region 18 depends on which of the individual rays 15 cannot pass through the pupil 21 as a result of an obscuration, which is caused by the passage opening 17 or by another obscuring component such as, for example, a stop. A gravity center SP of the pupil obscuration region 18, which, in respect of its x- and y-coordinates approximately coincides with the position of the center of the passage opening 17 on the mirror M6, does not lie centrally in the used pupil 21 of the projection optical unit 7 according to FIG. 2.

The pupil obscuration region 18 is mirror symmetrical in relation to the yz-plane of the pupil 21, i.e. it is mirror symmetrical to a symmetry plane of the imaging optical unit 7, which symmetry plane, in this embodiment, coincides with the meridional plane of the imaging optical unit 7 according to FIG. 2.

A center Z of the pupil 21 lies outside of the pupil obscuration region 18. The pupil obscuration region 18 lies decentrally in the pupil 21. In particular, the chief ray 16 of the central field point passes through the center Z of the pupil 21.

The dimensions A to D of the mirror M6 and of the passage opening 17 correspond to the dimensions A', B', C' and D' of the pupil 21 and of the pupil obscuration region 18. Here, A' is a radius of the pupil 21. B' is a y-offset of the pupil obscuration region 18 with respect to the center Z of the pupil 21. An extent of the pupil obscuration region 18 is 2C' in the y-direction and 2D' in the x-direction. The extent 2C' can also be understood as a radial extent of the pupil obscuration region 18 along a gravity center axis y, on which the center Z of the pupil 21 and the gravity center SP of the pupil obscuration region 18 lie. The dimension 2D' can be understood as a tangential pupil obscuration region extent in a tangential dimension x perpendicular to the gravity center axis y.

A complete, i.e. usable in an unobscured fashion, circular pupil region around the center Z of the pupil 21 has a radius B'-C', which is at least 10% of the pupil radius A'.

The projection optical unit 7 according to FIG. 2 can have a further obscuration stop or any other component which brings about an additional pupil obscuration, which leads to an overall pupil obscuration being created, which, overall, is arranged in a centrally symmetric fashion with respect to the center Z of the pupil 21. An example for an additional pupil obscuration is supplied in FIGS. 23 and 26, which will still be described below.

In the following text, a further embodiment of the projection optical unit 22 is explained on the basis of FIGS. 4 and 5, which projection optical unit can be used in the projection exposure apparatus 1 according to FIG. 1 in place of the projection optical unit 7. Components and functions which were already explained above in conjunction with FIGS. 1 to 3, 3a and in conjunction with FIG. 10, are, if need be, denoted by the same reference signs and will not be discussed again in detail.

The optical design data of the projection optical unit 22 can be gathered from the following tables, which, in their design, correspond to the tables in respect of the projection optical unit 7 according to FIG. 2. For specifying the free-form surfaces, use is made of the above Equation (2) ($RDY=1/c_y$; $RDX=1/c_x$).

TABLE 1 for FIG. 4

| Surface | Thickness | Operating mode | Half diameter |
| --- | --- | --- | --- |
| Image plane | 651.673414 | | 13.0 |
| M6 | −581.633915 | REFL | 314.4 |
| M5 | 1674.126362 | REFL | 70.9 |
| M4 | −782.530098 | REFL | 241.0 |
| M3 | 616.084305 | REFL | 124.9 |
| M2 | −637.047257 | REFL | 97.6 |
| M1 | 1259.319999 | REFL | 177.1 |
| Object plane | 0.000000 | | 52.2 |

TABLE 2 for FIG. 4

| Coeff. | M6 | M5 | M4 | M3 | M2 | M1 |
| --- | --- | --- | --- | --- | --- | --- |
| RDY | −695.461389 | −450.015516 | −1519.950809 | −2348.88962 | 1820.838079 | 1493.96274 |
| KY | 0 | 0 | 0 | 0 | 0 | 0 |
| RDX | −730.418621 | −718.136699 | −1479.858765 | −3054.558447 | 6693.502278 | 1587.769621 |
| KX | 0 | 0 | 0 | 0 | 0 | 0 |
| X2 Y1 | 2.593432E−08 | 1.008276E−06 | −1.548556E−08 | −4.495074E−07 | −3.447547E−07 | 4.728772E−08 |
| X0 Y3 | 1.816294E−09 | 6.271797E−07 | −1.605825E−08 | −3.699090E−07 | −7.367532E−07 | 1.006855E−08 |
| X4 Y0 | −2.581285E−11 | −2.088084E−09 | 3.051999E−13 | 1.974959E−11 | 3.300184E−10 | −3.316485E−11 |
| X2 Y2 | −3.739584E−11 | −5.201332E−09 | −4.932920E−12 | −1.943139E−10 | 4.007489E−10 | −9.057381E−11 |
| X0 Y4 | −1.960091E−11 | −2.927261E−09 | −6.382094E−12 | −3.413835E−10 | 3.824618E−10 | −4.825477E−11 |
| X4 Y1 | 3.946994E−14 | 1.245128E−11 | −8.869556E−15 | 5.859032E−14 | −2.835232E−12 | 8.835702E−14 |
| X2 Y3 | 5.305196E−14 | 2.996210E−11 | −1.699064E−14 | −2.778702E−13 | −3.060645E−12 | 1.653309E−13 |
| X0 Y5 | 1.033745E−14 | 5.872764E−12 | −5.576501E−15 | −3.243764E−14 | 2.022385E−12 | −1.378486E−15 |
| X6 Y0 | −5.740145E−17 | −1.776250E−14 | 2.677881E−18 | 1.664031E−16 | −4.528791E−18 | −8.226743E−18 |
| X4 Y2 | −1.315074E−16 | −8.338090E−14 | 3.142609E−19 | 3.636635E−16 | −1.014589E−14 | −8.961030E−17 |
| X2 Y4 | −1.208373E−16 | −1.615823E−13 | −7.895712E−18 | −2.946884E−16 | −1.454096E−14 | 4.458098E−17 |
| X0 Y6 | −5.239537E−17 | −1.092589E−13 | 1.209416E−18 | 1.458919E−15 | 6.187139E−15 | −2.229742E−17 |
| X6 Y1 | 7.298464E−20 | 1.211236E−16 | −2.299786E−20 | −1.479750E−18 | −1.529157E−17 | −9.138596E−21 |
| X4 Y3 | 1.686107E−19 | 2.849842E−16 | −8.405251E−21 | −3.591992E−18 | −5.266418E−17 | −1.020499E−19 |
| X2 Y5 | 1.145584E−19 | 3.389464E−16 | −1.467503E−20 | −5.688439E−19 | −3.004811E−17 | 3.191275E−19 |
| X0 Y7 | 3.578741E−20 | 7.817373E−16 | −2.703341E−20 | 3.109706E−18 | 4.993689E−17 | 4.566063E−19 |
| X8 Y0 | −1.216545E−22 | −1.254392E−19 | −1.102430E−22 | −5.265228E−21 | 2.711739E−20 | −3.611131E−23 |
| X6 Y2 | −4.039885E−22 | −8.796088E−19 | −2.365924E−23 | −2.130773E−20 | −4.745563E−21 | −5.250403E−22 |
| X4 Y4 | −5.567174E−22 | −1.745516E−18 | 8.417054E−23 | −3.925462E−20 | −8.037418E−22 | −1.475751E−21 |
| X2 Y6 | −3.573148E−22 | 2.260217E−18 | 7.241290E−24 | 2.922481E−20 | −5.586243E−21 | −3.974092E−21 |
| X0 Y8 | −4.504401E−23 | 9.625317E−18 | 1.611640E−22 | 8.946604E−20 | −7.108347E−19 | −2.529474E−21 |
| X8 Y1 | 6.991530E−26 | 3.525878E−21 | 7.154979E−25 | 1.193443E−22 | −1.219907E−21 | 1.248910E−24 |
| X6 Y3 | 3.156832E−25 | 1.192241E−20 | −5.107575E−25 | 6.025043E−23 | −2.766813E−21 | −1.568785E−25 |
| X4 Y5 | 5.024594E−25 | 1.971608E−20 | −1.147631E−24 | −2.665479E−22 | 1.160152E−22 | −1.530696E−24 |
| X2 Y7 | 4.665603E−25 | 4.593422E−20 | −4.483211E−25 | 2.001142E−22 | 5.372439E−21 | −3.151943E−24 |
| X0 Y9 | 9.623672E−26 | −1.793203E−20 | 2.150979E−24 | 1.237155E−21 | 2.122948E−21 | 4.190563E−25 |
| X10Y0 | −1.090326E−28 | −6.511812E−24 | 3.985185E−27 | 5.490790E−25 | −3.492145E−24 | 7.169228E−28 |
| X8 Y2 | −4.430812E−28 | −6.532166E−23 | 2.799477E−27 | 1.584518E−24 | −2.441906E−23 | 1.094222E−26 |
| X6 Y4 | −1.039695E−27 | −1.125062E−22 | −5.483577E−27 | 1.152915E−24 | −3.026542E−23 | 3.806355E−27 |
| X4 Y6 | −1.252913E−27 | −2.754617E−23 | −3.184822E−27 | 2.118193E−24 | 1.866549E−23 | 2.650401E−27 |
| X2 Y8 | −1.006737E−27 | −9.272916E−22 | 1.393890E−27 | 3.786350E−24 | 6.525206E−23 | 9.738379E−26 |
| X0 Y10 | −4.772904E−28 | −1.736900E−21 | 5.835930E−27 | 3.083628E−24 | 4.441742E−23 | 6.751120E−26 |
| X10Y1 | 4.688451E−31 | −4.414724E−27 | −1.068678E−29 | −5.395849E−27 | 1.145695E−26 | −1.389074E−29 |
| X8 Y3 | 1.723152E−30 | −1.115632E−25 | −5.240566E−31 | −1.202610E−26 | 7.367449E−27 | −1.970209E−29 |
| X6 Y5 | 3.104945E−30 | 9.246722E−25 | 1.887331E−29 | 5.739726E−27 | −3.841853E−26 | 8.525725E−29 |
| X4 Y7 | 3.348997E−30 | 9.853986E−25 | 3.099160E−29 | 5.630609E−26 | 1.328451E−25 | 2.209172E−29 |
| X2 Y9 | 7.843296E−31 | −3.250376E−24 | 2.377965E−29 | 4.388342E−26 | −1.006728E−25 | 3.004455E−29 |
| X0 Y11 | −2.913680E−33 | −1.718841E−24 | 4.341313E−30 | −2.149758E−26 | −1.149469E−25 | −1.049831E−28 |
| X12Y0 | −1.106988E−33 | 2.306411E−28 | −5.000261E−32 | −2.298423E−29 | 1.497569E−28 | −1.314752E−32 |
| X10Y2 | −5.075849E−33 | 1.055670E−27 | −6.567258E−32 | −8.524359E−29 | 5.013504E−28 | −7.410884E−32 |
| X8 Y4 | −1.136769E−32 | 2.669839E−27 | 4.759082E−32 | −1.083205E−28 | 9.590962E−28 | −3.194105E−32 |
| X6 Y6 | −1.515660E−32 | −2.553922E−26 | 1.151403E−31 | 3.898206E−29 | 2.389718E−28 | 9.912400E−31 |
| X4 Y8 | −1.412396E−32 | −5.392641E−26 | 9.606589E−32 | 2.552871E−28 | 2.056472E−28 | 4.875411E−31 |
| X2 Y10 | −5.093779E−33 | −1.467350E−26 | 4.861046E−32 | 1.335646E−28 | −2.310159E−27 | −5.254120E−31 |
| X0 Y12 | 8.540529E−35 | 1.148198E−25 | 3.549233E−33 | −8.236864E−29 | −1.101174E−27 | −9.384409E−31 |

TABLE 3 for FIG. 4

| Surface | Decentration DCX | Decentration DCY | Decentration DCZ | Tilt TLA [deg] | Tilt TLB [deg] | Tilt TLC [deg] |
|---|---|---|---|---|---|---|
| M6 | 0 | 0.023609 | 0.006571 | −5.094249 | 0 | 0 |
| M5 | 0 | 104.64638 | 0.013128 | −5.278718 | 0 | 0 |
| M4 | 0 | 93.256202 | 0.03352 | −11.491578 | 0 | 0 |
| M3 | 0 | 418.860993 | 0.029893 | −9.918672 | 0 | 0 |
| M2 | 0 | 448.13847 | 0.385249 | −8.967549 | 0 | 0 |
| M1 | 0 | 689.823399 | 0.013918 | −5.910404 | 0 | 0 |

The projection optical unit 22 has an image-side numerical aperture of 0.45. The object field 4 has an x-extent of two-times 13 mm and a y-extent of 2 mm. The projection optical unit 22 is optimized for an operating wavelength of the illumination light 3 of 13.5 nm.

In the projection optical unit 22, the mirror M4 is distanced far from the mirror M6. The distance between these two mirrors is approximately half the design length of the projection optical unit 22, i.e. half the distance between the object plane 5 and the image plane 9. In the projection optical unit 22, mirrors M3 and M6 on the one hand and mirrors M1 and M6 on the other hand are arranged back-to-back.

An intermediate image ZB lies in the imaging beam path between the mirrors M4 and M5, just after the passage through the passage opening 17 in the mirror M6. A distance between the intermediate image ZB and the passage opening 17 is approximately 10% of a distance between the mirrors M4 and M5.

Figure 5:
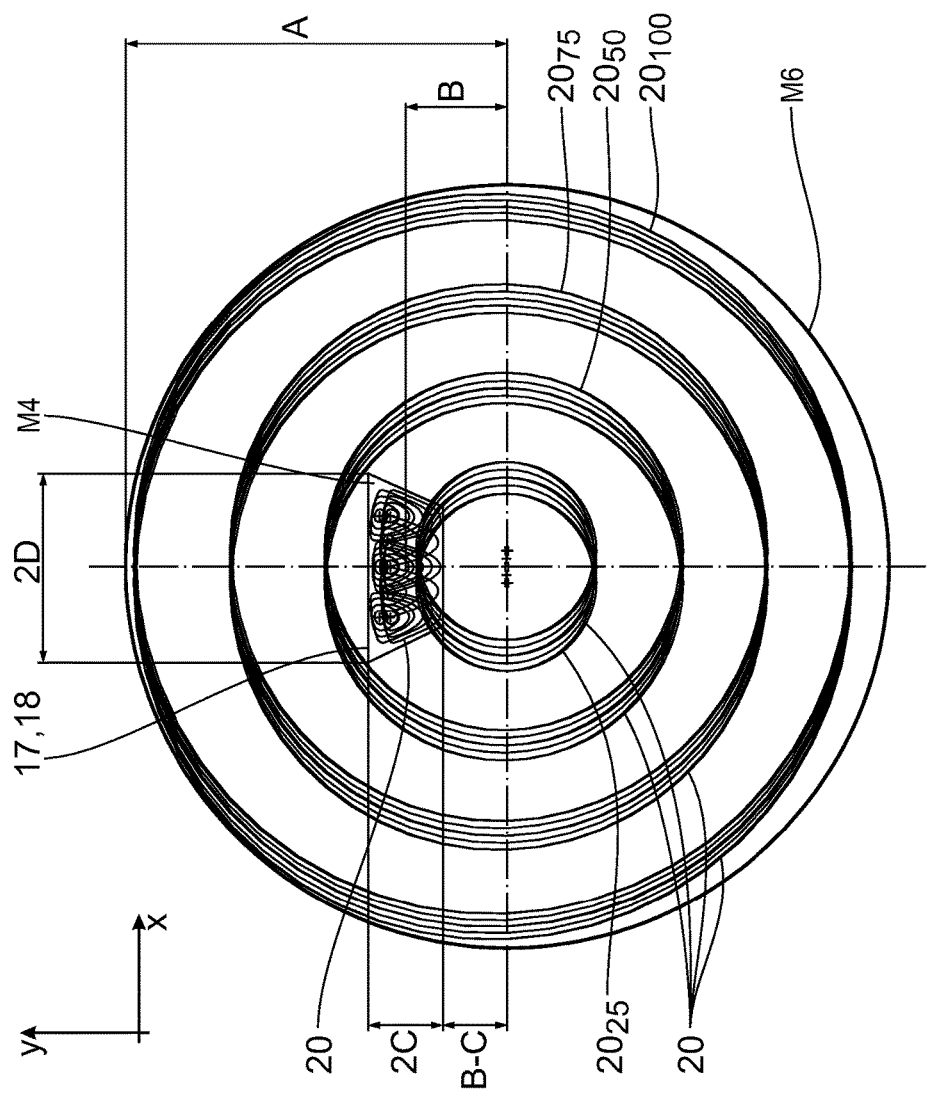
FIG. 5 shows, in an illustration similar to FIG. 3, the aperture zones firstly in the case of the reflection on the last mirror of the imaging optical unit according to FIG. 4 and secondly when imaging radiation passes through an imaging light passage opening of the last mirror in the imaging beam path between the antepenultimate and the penultimate mirror of the imaging optical unit.

FIG. 5 clarifies the relationships during the reflection of the imaging light 3 at the mirror M6 and when the imaging light 3 passes through the passage opening 17 in the mirror M6. Since the intermediate image ZB is at a distance from the passage opening 17 in the projection optical unit 22, the sub-apertures 20 are significantly larger when passing through the imaging light passage opening 17 than in the projection optical unit 7 according to FIGS. 2 and 3. Due to the shape of the sub-apertures 20 when passing through the passage opening 17, the passage opening 17 in the mirror M6 can have a trapezoidal design, wherein an x-extent of the passage opening 17 adjacent to the center of the mirror M6 is smaller than at a distance therefrom.

The following applies to the size ratios of the dimensions A to D in the projection optical unit 22: B/A equals 0.28. C/A equals 0.09. D/A equals 0.20.

Figure 7:
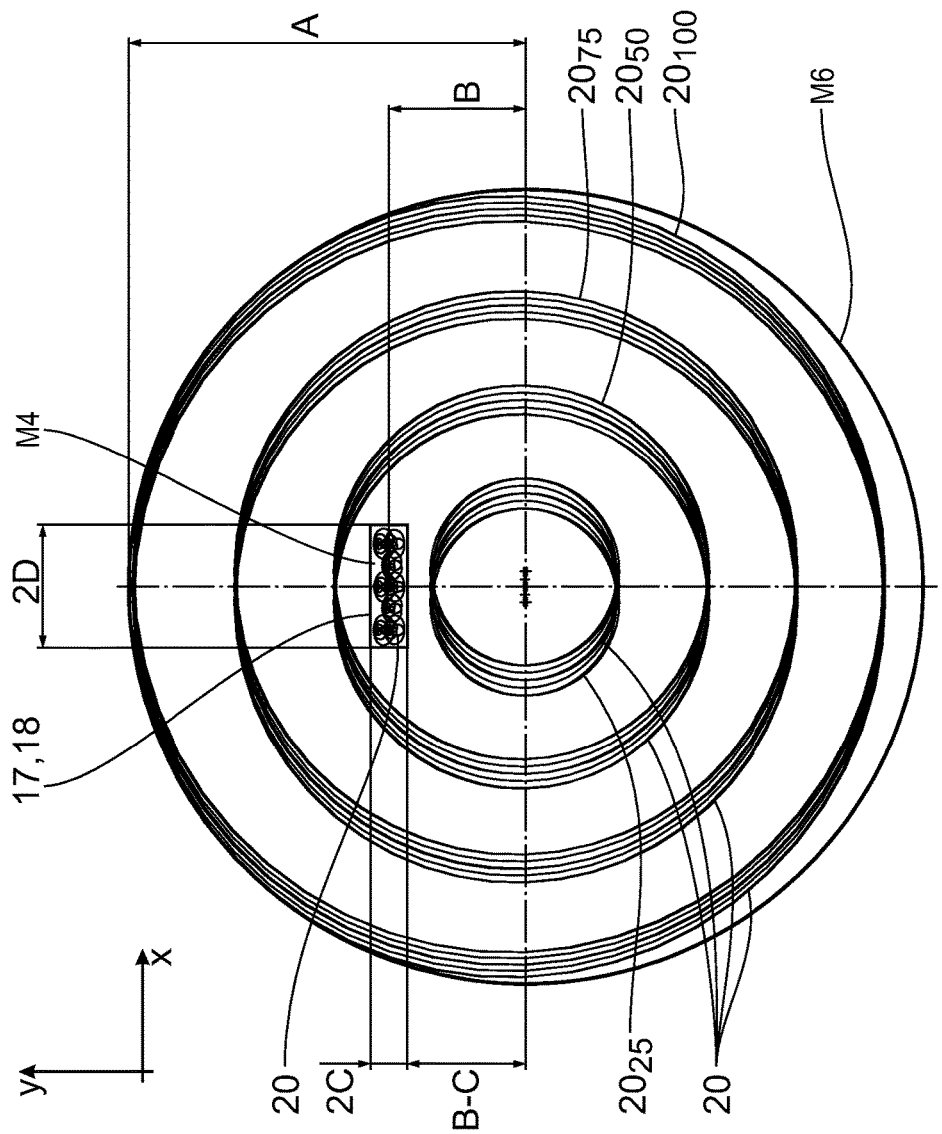

In the following text, a further embodiment of a projection optical unit 23 is explained on the basis of FIGS. 6 and 7, which projection optical unit can be used in the projection exposure apparatus 1 according to FIG. 1 in place of the projection optical unit 7. Components and functions which were already explained above in conjunction with FIGS. 1 to 3, 3a, 4 and 5 and in conjunction with FIG. 10, are, if need be, denoted by the same reference signs and will not be discussed again in detail.

The optical design data of the projection optical unit 23 can be gathered from the following tables, which, in their design, correspond to the tables in respect of the projection optical unit 22 according to FIG. 4. For specifying the free-form surfaces, use is made of the above Equation (2) (RDY=1/$c_y$; RDX=1/$c_x$.

TABLE 1 for FIG. 6

| Surface | Thickness | Operating mode | Half diameter |
|---|---|---|---|
| Image plane | 706.281537 |  | 13.0 |
| M6 | −621.018258 | REFL | 338.1 |
| M5 | 1713.726505 | REFL | 73.9 |
| M4 | −776.763139 | REFL | 134.8 |
| M3 | 827.203449 | REFL | 124.5 |
| M2 | −1499.476236 | REFL | 70.3 |
| M1 | 1850.012819 | REFL | 279.5 |
| Object plane | 0.000000 |  | 52.2 |

TABLE 2 for FIG. 6

| Coeff. | M6 | M5 | M4 | M3 | M2 | M1 |
|---|---|---|---|---|---|---|
| RDY | −747.12635 | −409.759541 | −2173.423913 | 3982.203835 | 726.983083 | 2009.73162 |
| KY | 0 | 0 | 0 | 0 | 0 | 0 |
| RDX | −801.662287 | −1100.021516 | −2128.414553 | 3252.890349 | 931.91793 | 2127.12565 |
| KX | 0 | 0 | 0 | 0 | 0 | 0 |
| X2 Y1 | −2.454346E−08 | −1.109492E−06 | −1.357619E−08 | −3.184366E−08 | −1.796811E−06 | −8.420255E−09 |
| X0 Y3 | 2.015085E−09 | −8.488218E−07 | −2.650922E−08 | −6.898797E−08 | −4.886282E−07 | −3.320462E−09 |
| X4 Y0 | −3.021203E−11 | −2.195513E−09 | 8.241807E−12 | 6.561124E−13 | 1.713736E−09 | 1.871677E−12 |
| X2 Y2 | −3.554874E−11 | −8.712265E−09 | 2.559437E−11 | −2.674776E−12 | −1.304012E−09 | 3.054135E−12 |
| X0 Y4 | −1.280832E−11 | −5.236056E−09 | 2.476158E−11 | 3.961508E−12 | −2.385370E−09 | −6.954573E−13 |
| X4 Y1 | −3.171192E−14 | −1.020671E−11 | −8.632228E−15 | 6.304204E−16 | −1.399176E−11 | −1.325883E−15 |
| X2 Y3 | −1.862728E−14 | −1.603489E−11 | −2.318963E−14 | 8.164395E−15 | 1.483946E−11 | 3.678063E−16 |
| X0 Y5 | 6.916264E−15 | 6.607051E−12 | −1.314948E−14 | 1.961173E−14 | 1.580676E−11 | 3.331380E−15 |
| X6 Y0 | −5.415140E−17 | −1.401335E−14 | 3.394312E−18 | 2.811769E−18 | 1.172239E−14 | 4.821276E−19 |
| X4 Y2 | −1.234771E−16 | −7.266192E−14 | −5.619772E−19 | −5.153074E−17 | −6.011094E−14 | −3.107715E−19 |
| X2 Y4 | −1.096586E−16 | −5.156501E−14 | 1.430262E−17 | −1.776227E−17 | −1.068179E−13 | −3.704452E−18 |
| X0 Y6 | −2.673625E−17 | 1.688120E−14 | −2.122419E−17 | 1.354395E−16 | −6.082008E−14 | −6.105630E−18 |
| X6 Y1 | −5.243813E−20 | −7.353344E−17 | 5.018307E−21 | 2.497298E−20 | −2.936882E−16 | 3.369984E−22 |
| X4 Y3 | −7.137648E−20 | −7.906192E−17 | −4.423251E−20 | −5.462271E−20 | 3.891629E−16 | 9.757633E−22 |
| X2 Y5 | −1.163719E−20 | 2.474240E−16 | −9.250079E−20 | 2.688400E−19 | 9.228817E−16 | 2.755628E−21 |
| X0 Y7 | 9.940213E−21 | 1.486653E−16 | −1.392298E−18 | −2.263192E−18 | 1.631708E−16 | 4.127315E−21 |
| X8 Y0 | −9.533542E−23 | −9.638021E−20 | −2.030684E−23 | −4.792429E−23 | 3.144263E−19 | −1.325834E−24 |
| X6 Y2 | −3.045862E−22 | −5.265596E−19 | −1.291363E−22 | −1.526217E−22 | −1.342884E−18 | −4.673901E−24 |
| X4 Y4 | −4.348277E−22 | −7.424507E−19 | −4.263539E−22 | −3.729897E−22 | −4.362225E−18 | −3.275754E−24 |
| X2 Y6 | −2.435751E−22 | −3.422203E−18 | 1.827204E−21 | −8.541847E−22 | −1.299477E−17 | 1.643580E−23 |
| X0 Y8 | −7.043380E−23 | −1.935580E−17 | 1.442801E−20 | 6.396588E−21 | −1.053535E−17 | 1.750477E−22 |
| X8 Y1 | −4.742528E−26 | −1.177943E−21 | −1.664648E−25 | −7.092728E−25 | 3.305303E−21 | −1.313031E−27 |
| X6 Y3 | −1.369107E−25 | −2.823968E−21 | 2.101807E−25 | −1.282716E−24 | 2.667638E−20 | 2.797377E−27 |

TABLE 2-continued for FIG. 6

| Coeff. | M6 | M5 | M4 | M3 | M2 | M1 |
|---|---|---|---|---|---|---|
| X4 Y5 | −4.548720E−26 | −1.316834E−20 | 4.196162E−24 | −4.240499E−24 | 9.154864E−20 | −1.724111E−26 |
| X2 Y7 | 8.814121E−26 | −8.463671E−20 | 3.405997E−24 | −2.705899E−23 | 1.184935E−19 | −1.191188E−25 |
| X0 Y9 | 8.373042E−26 | −4.085067E−20 | 6.796008E−23 | 1.345048E−22 | 1.551435E−19 | −1.476253E−25 |
| X10Y0 | −7.611153E−29 | −1.979769E−24 | 3.997219E−28 | 7.126502E−27 | −2.362931E−23 | 1.533682E−29 |
| X8 Y2 | −4.212830E−28 | −1.552556E−23 | 1.362516E−28 | −1.132624E−27 | −1.450686E−22 | 7.999105E−29 |
| X6 Y4 | −8.363990E−28 | −3.475342E−23 | 1.437267E−26 | 1.585607E−26 | −2.582289E−22 | 7.672918E−29 |
| X4 Y6 | −8.149050E−28 | −1.262575E−22 | −1.063518E−26 | −6.865757E−26 | −3.074063E−22 | −3.091263E−29 |
| X2 Y8 | −6.090593E−28 | 4.012877E−23 | −2.129133E−25 | −1.299623E−25 | 1.085587E−21 | −1.961467E−28 |
| X0 Y10 | −1.521635E−28 | 1.877412E−21 | −8.336005E−25 | −5.881751E−25 | 1.104056E−21 | −1.571944E−27 |
| X10Y1 | −2.531911E−31 | 5.455006E−27 | 8.656423E−31 | 4.682402E−30 | −4.849965E−25 | 3.689890E−33 |
| X8 Y3 | −7.791539E−31 | 1.193025E−26 | 3.588515E−30 | 2.460768E−29 | −6.641787E−25 | 1.083766E−33 |
| X6 Y5 | −8.809932E−31 | 7.541422E−26 | −2.514062E−29 | 1.051132E−28 | −1.869656E−24 | 4.205232E−32 |
| X4 Y7 | −3.726916E−31 | 1.100707E−24 | −1.038336E−28 | 3.592851E−28 | −5.760368E−24 | 2.312477E−31 |
| X2 Y9 | −2.040298E−31 | 1.033304E−23 | −1.027341E−28 | 8.346401E−28 | −8.590000E−24 | 1.413437E−30 |
| X0 Y11 | −1.710826E−31 | 4.554246E−24 | −1.432802E−27 | −2.768036E−27 | −1.410204E−23 | 9.566551E−31 |
| X12Y0 | −5.700041E−34 | 2.625952E−29 | −3.179812E−33 | −1.153792E−32 | 1.754485E−27 | −6.061127E−35 |
| X10Y2 | −2.542158E−33 | 3.128382E−28 | 1.122020E−32 | 3.986834E−32 | 6.106965E−27 | −4.321193E−34 |
| X8 Y4 | −6.046512E−33 | 4.087792E−28 | −5.358173E−32 | 7.866692E−32 | 1.101733E−26 | −6.320508E−34 |
| X6 Y6 | −8.021967E−33 | 1.243796E−27 | −4.058429E−31 | 1.830034E−31 | 3.544504E−26 | −1.244963E−34 |
| X4 Y8 | −5.760053E−33 | 1.498638E−26 | 1.518722E−30 | 5.287072E−30 | 3.635412E−26 | 5.651084E−34 |
| X2 Y10 | −1.003353E−33 | 7.425038E−27 | 6.410781E−30 | 6.104701E−30 | −9.300116E−26 | 1.252693E−33 |
| X0 Y12 | 4.349930E−34 | −2.325684E−26 | 1.822417E−29 | 1.696503E−29 | −4.027101E−26 | 6.415800E−34 |

TABLE 3 for FIG. 6

| Surface | Decentration DCX | Decentration DCY | Decentration DCZ | Tilt TLA [deg] | Tilt TLB [deg] | Tilt TLC [deg] |
|---|---|---|---|---|---|---|
| M6 | 0 | −0.189603 | 0 | −5.726793 | 0 | 0 |
| M5 | 0 | 125.576102 | 0 | −5.889221 | 0 | 0 |
| M4 | 0 | 114.379416 | 0 | −7.853088 | 0 | 0 |
| M3 | 0 | 327.409628 | 0 | −1.142571 | 0 | 0 |
| M2 | 0 | 514.301212 | 0 | 2.284343 | 0 | 0 |
| M1 | 0 | 762.908993 | 0 | −0.133649 | 0 | 0 |

The projection optical unit 23 has an image-side numerical aperture of 0.45. The object field 4 has an x-extent of two-times 13 mm and a y-extent of 2 mm. The projection optical unit 23 is optimized for an operating wavelength of the illumination light 3 of 13.5 nm.

In terms of its design, the projection optical unit 23 is similar to the projection optical unit 22 according to FIGS. 4 and 5. In contrast thereto, an intermediate image ZB is arranged between the mirrors M4 and M5 in the imaging beam path, level with the passage opening 17 in mirror M6. In contrast to the projection optical unit 22, the mirror M1 is closer to the image plane 9 than the mirror M6 in the projection optical unit 23. The mirrors M3 and M6 are once again arranged back-to-back. In turn in contrast to the projection optical unit 22, the mirror M2 is closer to the object plane 5 than the mirror M4 in the projection optical unit 23. Furthermore, the intermediate image ZB lies geometrically closer to the mirror M6 in the projection optical unit 23, and so the passage opening 17 in the mirror M6 can have a correspondingly small design.

FIG. 7 once again clarifies the relationships during the reflection at the mirror M6 or when passing through this mirror M6.

In respect of the dimensional ratios of the dimensions A to D, the following applies in the projection optical unit 23: B/A equals 0.34. C/D equals 0.045. D/A equals 0.15.

The dimensional ratios of the dimensions A to D specified above for the projection optical units 7, 22 and 23 correspondingly apply also to the dimensional ratios A' to D' of the pupil obscuration region 18.

FIGS. 8 to 19 and 23 to 26 will be used below to explain the illumination and imaging relationships in the projection exposure apparatus 1. In this case, it is unimportant which one of the projection optical units 7, 22 or 23 is used. In the following text, the illumination and imaging relationships are explained in an exemplary fashion on the basis of the projection optical unit 7.

FIG. 8 shows an illumination setting, i.e. an illumination intensity distribution, in an illumination pupil 24 of the illumination optical unit 6 of the projection exposure apparatus 1. The illumination setting is an x-dipole with two secondary illumination light sources 25, 26. The case is considered where a line structure with lines 27 (see FIG. 9) is illuminated as reticle 10, which lines extend parallel to the y-direction and have a distance 61 from one another. The y-line structure according to FIG. 9 is, as a result of the x-dipole illumination setting according to FIG. 8, illuminated from two illumination directions according to the secondary illumination light sources 25, 26.

FIG. 10 clarifies an intensity distribution of imaging light in the used pupil 21 of the projection optical unit 7 as a result of the illumination by purely the illumination light source 25. The illustrated pupil obscuration region 18 is not a physical obscuration stop, which can for example lie on one of the three mirrors M1, M2 or M3 for defining the pupil obscuration region 18. The pupil obscuration region 18 specified in FIG. 10 and the subsequent figures constitutes a projection of the actual obscurations in the entry pupil 21 of the respective projection optical unit 7, 22 and 23.

The actual physical obscuration stop can be deformed with respect to the entry pupil 21. Such a physical obscuration stop can, in the projection optical unit 7 according to FIG. 2, for example be applied to the mirror M2 since this mirror lies in the region of a pupil plane of the projection optical unit 7. Corresponding statements apply to the projection optical units 22 and 23.

In FIGS. 8 to 19 and 23 to 26, the pupil obscuration region 18 is illustrated in a shaded manner in the form of a circular obscuration. The actual shape of the obscuration projected into the entry pupil 21 can deviate from a circular obscuration and can be elliptical, rectangular, rectangular with rounded-off corners, trapezoidal or trapezoidal with rounded-off corners.

A zero order of diffraction 28 of the illumination light 3, in its position corresponding to the illumination light source 25, passes through the pupil 21 as imaging light. As a result of the diffraction on the lines 27, a first order of diffraction 29 passes through the pupil 21 at a point which coincidentally corresponds to the point of the second illumination light source 26. Since the two orders of diffraction 28, 29 do not overlap with the pupil obscuration region 18, the pupil obscuration as a result of the passage opening 17 in the mirror M6 plays no role for the imaging light 3 which passes through the projection optical unit 7 in the case of illumination according to FIG. 8. Hence, in the illumination setting according to FIG. 8, the imaging light passes through the projection optical unit 7 without there being losses in the reflection at the mirror M6 as a result of the passage opening 17.

In the following text, the illumination and imaging relationships in the projection exposure apparatus 1 when illuminating a further reticle 10 with a less tightly packed y-line structure are explained on the basis of FIGS. 11 to 13, which correspond to FIGS. 8 to 10. Neighboring lines 30 of the reticle 10 according to FIG. 12 have a distance 62 from one another, which is approximately twice the size of the line distance 61 of the reticle 10 according to FIG. 9. As a result of the larger line distance, there is a smaller diffraction angle during the diffraction of the illumination light 3 from the direction of the illumination light source 25, the extent of which through the projection optical unit 7 being illustrated schematically in FIG. 13. As a result of the smaller diffraction angle, the first order of diffraction 21 now lies approximately centrally in the pupil 21. A second order of diffraction 31 likewise lies within the used pupil 21 during the illumination of the y-line structure with the lines 30 according to FIG. 12 and it lies at a point which coincidentally corresponds to the point of the illumination light source 26 in the illumination pupil 24.

Since the diameter of the first order of diffraction 29 in the imaging light beam path according to FIG. 13 is greater than a y-distance of the pupil obscuration region 18 from the center Z of the pupil 21, the first order of diffraction 29 and the pupil obscuration region 18 overlap. However, since the overlap region is small compared to the overall extent of the first order of diffraction 29, this still results in good imaging of the lines 30. The decentral position of the pupil obscuration region 18 in the entry pupil 21 prevents the pupil obscuration region 18 from overlapping with the first order of diffraction 29, which would undesirably result in this first order of diffraction 29 not contributing to imaging the object with the lines 30, as a result of which, in turn, imaging of such an object structure would be badly afflicted.

FIGS. 14 to 19 show imaging relationships using figures that correspond to FIGS. 8 to 13.

FIG. 14 shows an illumination setting in the form of a y-dipole with secondary illumination light sources 32, 33, which are used to illuminate a reticle 10 with an x-line structure with lines 34 (see FIG. 15).

FIG. 16 in turn shows the intensity of the imaging light in the pupil 21 of the projection optical unit 7 as a result of the illumination by purely the illumination light source 33. This once again results in a zero order of diffraction 35 and a first order of diffraction 36 in the pupil 21. The zero order of diffraction 35 lies at the point corresponding to the illumination light source 33 and the first order of diffraction 36 coincidentally lies at the point in the pupil 21 which corresponds to the point of the other illumination light source 32. The first order of diffraction 36 and the pupil obscuration region 18 overlap one another. Once again, this overlap is small, and so in practice it does not adversely affect imaging the lines 34.

FIGS. 17 to 19 in turn show the relationships in the illumination of a reticle 10 with lines 37, which are spaced apart at a greater distance and extend in the x-direction, using the y-dipole illumination setting according to FIG. 14. Then, the zero order of diffraction 35, the first order of diffraction 36, which lies approximately centrally in the pupil 21, and a second order of diffraction 38 result in the pupil 21 of the projection optical unit 7. Both the first order of diffraction 36 and the second order of diffraction 38 overlap with the pupil obscuration region 18. Once again, this overlap is small in each case, and so in practice it does not adversely affect the imaging of the lines 37.

The overlap geometries of the pupil obscuration region 18 with orders of diffraction 36 or 38 when imaging an x-line structure with a y-dipole can be avoided by virtue of the fact that the reticle 10 according to FIGS. 15 and 18 with lines 34 and 37 is rotated by 90° about the local z-axis prior to the illumination, such that this results in a y-line structure in accordance with FIGS. 9 and 12. An x-dipole illumination setting according to FIG. 8 is then selected in place of the y-dipole illumination setting according to FIG. 14. In particular, in the illumination geometry and line orientation geometry according to FIG. 8 to 13, the case can be avoided that one of the orders of diffraction coincidentally lies more or less precisely at the point of the pupil obscuration region 18.

FIG. 20 schematically shows part of the illumination beam path of the projection optical units 7, 22 and 23 after the reflection at the mirror M4. The chief ray 16 of the central object field point is illustrated from the passage through the passage opening 17 up until incidence on the substrate 12.

An angle of incidence of the chief ray 16 on the mirror M6 is denoted by a' in FIG. 20.

When passing through the passage opening 17, the chief ray 16 extends to the mirror M5 along a passage chief ray section 16D. Between the last mirror M6 and the image field 8, i.e. the substrate 12, the chief ray 16 extends along an image field chief ray section 16B. The two chief ray sections 16D and 16B extend in a common plane, namely in the yz-meridional plane of the projection optical unit 7, 22, 23 and include a chief ray angle between one another, which is denoted by α in FIG. 20.

The following applies: α'>α.

Figure 25:
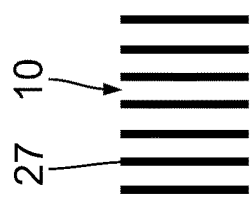

FIGS. 21 to 26 in turn show imaging relationships with figures which correspond to FIGS. 8 to 13, wherein, in FIGS. 21 to 26, use is also made, like in FIGS. 8 to 13, of the reticle 10 with the more tightly extending y-line structure (FIG. 22) and the less tightly extending y-line structure (FIG. 25).

The x-dipole setting with the secondary illumination light sources 25, 26 and the orders of diffraction 28, 29 and 31 correspond to that which was already explained above with reference to FIGS. 8 to 13.

Figure 21:
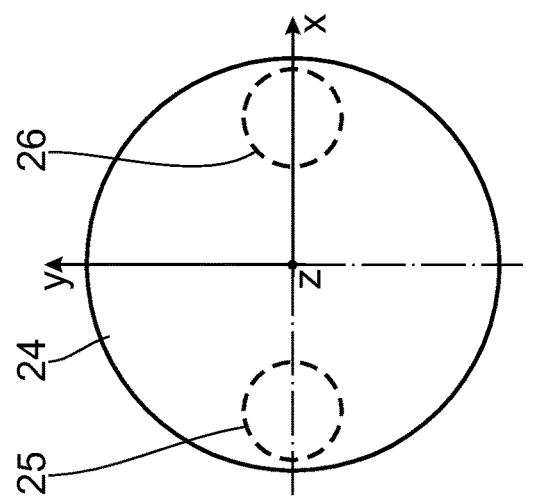
Figure 24:
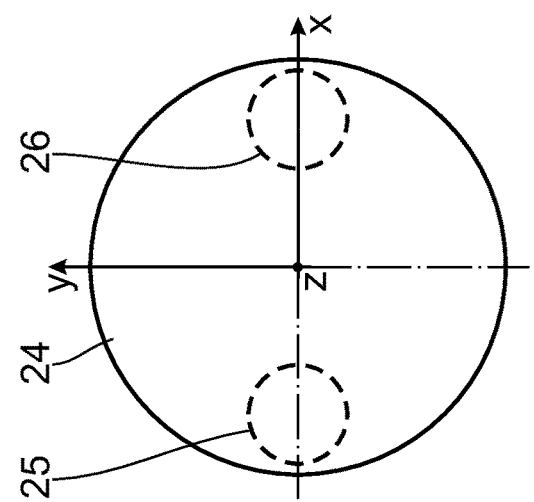

During imaging which uses the illumination pupil 24 according to FIGS. 21 and 24, use is made of an additional obscuration element such that an overall pupil obscuration region 39 with portions 39a and 39b is generated, which complement one another to form an overall pupil obscuration region 39 arranged in a centrally symmetric fashion with respect to the center Z of the pupil 21. The additional obscuration component, which generates the obscuration portion 39b, can be created by an appropriate stop in a pupil of the imaging optical unit 7, 22 or 23.

Figure 23:
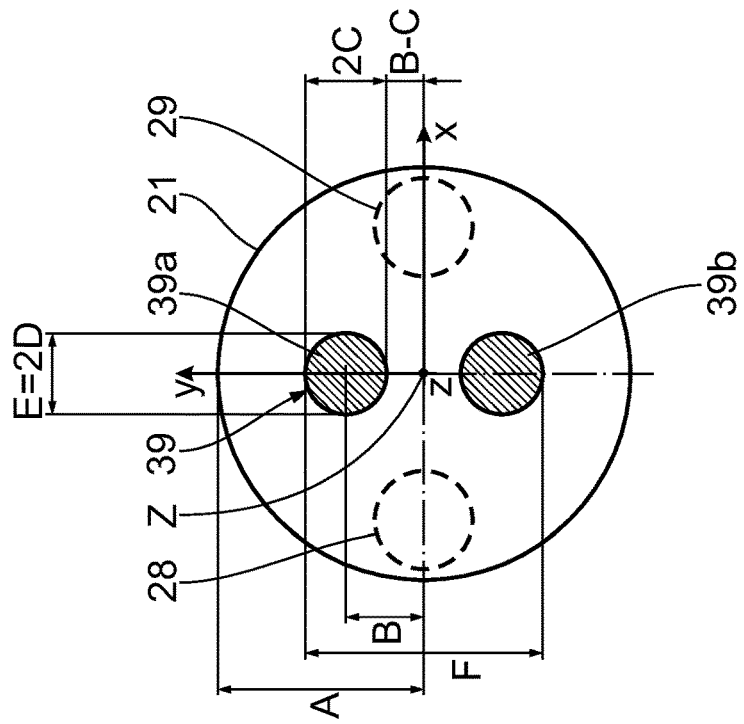
Figure 22:
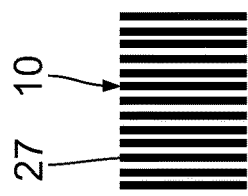
Figure 26:
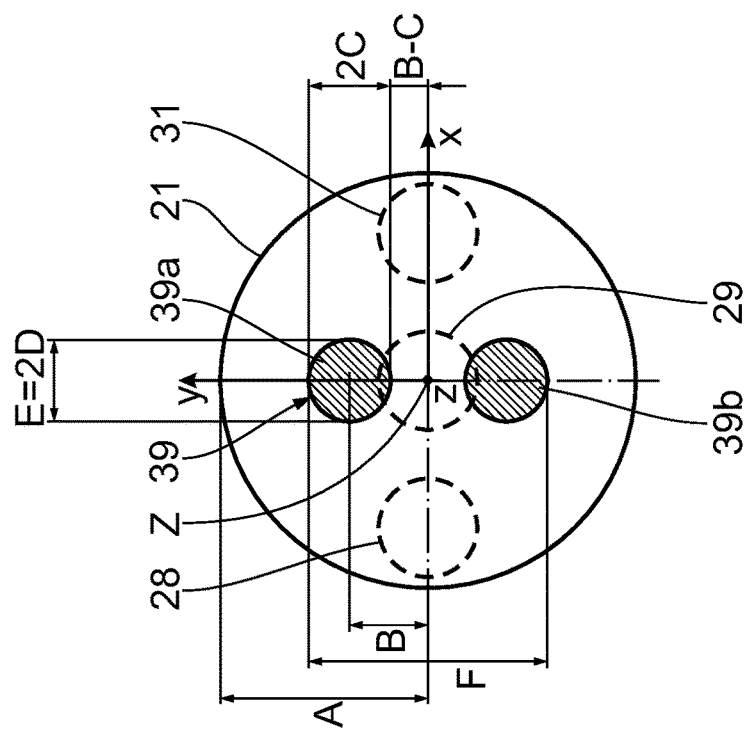

The overall pupil obscuration region 39 according to FIGS. 23 and 26 has an extent of E in the x-direction and an extent of F in the y-direction. This results in an aspect ratio E/F which is smaller than 1 and, in the illustrated embodiment, is approximately 0.33.

In place of the above-described pupil obscuration portions 39a, 39b, use can also be made of an elliptical, rectangular or trapezoidal pupil obscuration region, which can be arranged centered with respect to the center Z of the pupil 21, or else decentered with respect thereto. To the extent that such a pupil obscuration region has an edge with a number of corners, it can have rounded-off corners.

In order to produce a microstructured or nanostructured component, the projection exposure apparatus 1 is used as follows: first of all, the reflection mask 10 or the reticle and the substrate or the wafer 11 are provided. Subsequently, a structure on the reticle 10 is projected onto a light-sensitive layer of the wafer 11 with the aid of the projection exposure apparatus 1. By developing the light-sensitive layer, a microstructure or nanostructure is then produced on the wafer 11 and hence the microstructured component is produced.

Prior to the projection exposure, structures on the reticle 10 can be checked in terms of the structure in order, optionally, to bring about an illumination and imaging geometry in which orders of diffraction of the illumination light do not overlap, or do not overlap too strongly, with the pupil obscuration region 18 in order to avoid an adverse effect on the imaging power of the projection exposure apparatus 1.

The invention claimed is:

1. An imaging optical unit, comprising:
a plurality of optical components configured to image an object field into an image field,
wherein:
the imaging optical unit has an obscured pupil so that, during use of the imaging optical unit, a chief ray of a central field point passes through a center of the obscured pupil of the imaging optical unit; and
a gravity center of a contiguous pupil obscuration region of the imaging optical unit lies de-centrally in the obscured pupil of the imaging optical unit.

2. The imaging optical unit of claim 1, wherein the imaging optical unit has a plane of symmetry, and the pupil obscuration region is mirror symmetrical with respect to the plane of symmetry of the imaging optical unit.

3. The imaging optical unit of claim 2, wherein the center of the obscured pupil lies outside of the pupil obscuration region.

4. The imaging optical unit of claim 3, wherein the obscured pupil has a pupil diameter in a pupil plane of the imaging optical unit, and a complete usable pupil region about the center of the obscured pupil has a diameter which is at least 10% of the pupil diameter.

5. The imaging optical unit of claim 4, wherein:
the pupil obscuration region has a radial pupil obscuration region extent in a radial dimension along a gravity center axis on which the center of the obscured pupil and the gravity center of the pupil obscuration region lie;
the pupil obscuration region has a tangential pupil obscuration region extent in a tangential dimension perpendicular to the gravity center axis; and
the radial pupil obscuration region extent differs from the tangential pupil obscuration region extent by more than 10%.

6. The imaging optical unit of claim 5, wherein the imaging optical unit is a catoptric lens.

7. The imaging optical unit of claim 6, wherein:
the plurality of imaging optical components comprises a penultimate mirror and a last mirror which are upstream of the image plane along a beam path of imaging light through the imaging optical unit during use of the imaging optical unit;
a chief ray of a central field point impinges on the last mirror of the imaging optical unit at an angle of incidence during use of the imaging optical unit;
in the imaging beam path upstream of the penultimate mirror, the chief ray passes through a passage opening in the last mirror and extends along a passage chief ray section during use of the imaging optical unit;
the chief ray extends along an image field chief ray section between the last mirror and the image field;
the passage chief ray section and the image chief ray section extend in a common plane and include a chief ray angle between each other; and
the angle of incidence is greater than the chief ray angle.

8. The imaging optical unit of claim 7, comprising an additional obscuration component configured to generate an additional pupil obscuration region during use of the imaging optical unit, wherein the two pupil obscuration regions complement each other to define an overall pupil obscuration region which is arranged in a centrally symmetric fashion with respect to the center.

9. The imaging optical unit of claim 3, wherein the obscured pupil has a pupil diameter in a pupil plane of the imaging optical unit, and a complete usable pupil region about the center of the obscured pupil has a diameter which is at least 20% of the pupil diameter.

10. The imaging optical unit of claim 1, wherein the center of the obscured pupil lies outside of the pupil obscuration region.

11. The imaging optical unit of claim 1, wherein the obscured pupil has a pupil diameter in a pupil plane of the imaging optical unit, and a complete usable pupil region about the center of the obscured pupil has a diameter which is at least 10% of the pupil diameter.

12. The imaging optical unit of claim 1, wherein:
the pupil obscuration region has a radial pupil obscuration region extent in a radial dimension along a gravity center axis on which the center of the obscured pupil and the gravity center of the pupil obscuration region lie;
the pupil obscuration region has a tangential pupil obscuration region extent in a tangential dimension perpendicular to the gravity center axis; and
the radial pupil obscuration region extent differs from the tangential pupil obscuration region extent by more than 10%.

13. The imaging optical unit of claim 1, wherein the imaging optical unit is a catoptric lens.

14. The imaging optical unit of claim 1, comprising an additional obscuration component configured to generate an additional pupil obscuration region during use of the imaging optical unit, wherein the two pupil obscuration regions complement each other to define an overall pupil obscuration region which is arranged in a centrally symmetric fashion with respect to the center.

15. An optical system, comprising:
an imaging optical unit according to claim 1; and
an illumination optical unit configured to guide illumination light to the object field of the imaging optical unit.

16. An apparatus, comprising:
a light source configured to provide illumination light;
an imaging optical unit according to claim 1; and
an illumination optical unit configured to guide the illumination light to the object field of the imaging optical unit,
wherein the apparatus is a projection exposure apparatus for projection lithography.

17. A method of using a projection exposure apparatus for projection lithography which comprises an imaging optical unit and an illumination optical unit, the method comprising:
using the illumination optical unit to illuminate a structure of a reticle; and
using the imaging optical unit to image at least a portion of the illuminated structure of the reticle onto a light-sensitive material,
wherein the imaging optical unit comprises an imaging optical unit according to claim 1.

18. An imaging optical unit configured to image an object field into an image field, the imaging optical unit comprising:
a plurality of mirrors,
wherein:
the imaging optical unit is a catoptric imaging optical unit;
the imaging optical unit has an obscured pupil;
during use of the imaging optical unit, a chief ray of a central field point passes through a center of the obscured pupil of the imaging optical unit;
the plurality of mirrors comprises a last mirror upstream of the image field along a beam path of imaging light through the imaging optical unit during use of the imaging optical unit;
the last mirror has an opening along the beam path of the imaging light;
an edge surface of a reflection surface of the last mirror is configured to contiguously reflect the imaging light during use of the imaging optical unit;
the plurality of mirrors comprises a penultimate mirror upstream of the image field along the beam path of the imaging light;
the penultimate mirror has a reflection surface that does not have an opening along the beam path of the imaging light;
the opening in the last mirror is configured so that, during use of the imaging optical unit, the opening in the last mirror generates a pupil obscuration region which does not lie centrally in the obscured pupil of the imaging optical unit.

19. An optical system, comprising:
an imaging optical unit according to claim 18; and
an illumination optical unit configured to guide illumination light to the object field of the imaging optical unit.

20. An apparatus, comprising:
a light source configured to provide illumination light;
an imaging optical unit according to claim 18; and
an illumination optical unit configured to guide the illumination light to the object field of the imaging optical unit,
wherein the apparatus is a projection exposure apparatus for projection lithography.

21. A method of using a projection exposure apparatus for projection lithography which comprises an imaging optical unit and an illumination optical unit, the method comprising:
using the illumination optical unit to illuminate a structure of a reticle; and
using the imaging optical unit to image at least a portion of the illuminated structure of the reticle onto a light-sensitive material,
wherein the imaging optical unit comprises an imaging optical unit according to claim 18.

22. An imaging optical unit configured to image an object field into an image field, wherein:
the imaging optical unit has an obscured pupil; and
an overall pupil obscuration region of the imaging optical unit, or portions thereof, has an aspect ratio which deviates from one with respect to mutually perpendicular coordinates of a pupil coordinate system.

* * * * *

UNITED STATES PATENT AND TRADEMARK OFFICE
CERTIFICATE OF CORRECTION

PATENT NO. : 10,139,734 B2
APPLICATION NO. : 14/524162
DATED : November 27, 2018
INVENTOR(S) : Alexander Epple, Ralf Mueller and Hans-Juergen Rostalski Page 1 of 1

It is certified that error appears in the above-identified patent and that said Letters Patent is hereby corrected as shown below:

In the Specification

Column 7, Line 66, delete "VT'." and insert -- $X^m Y^n$. --.

Column 16, Line 4, delete "$1/c_x$." and insert -- $1/c_x$). --.

Column 22, Line 43, delete "16D." and insert -- $16_D$. --.

Column 22, Line 45, delete "16B." and insert -- $16_B$. --.

Column 22, Line 46, delete "16D and 16B" and insert -- $16_D$ and $16_B$ --.

Signed and Sealed this
Ninth Day of April, 2019

Andrei Iancu
*Director of the United States Patent and Trademark Office*